(12) United States Patent
Yamazaki et al.

(10) Patent No.: US 7,342,258 B2
(45) Date of Patent: Mar. 11, 2008

(54) SEMICONDUCTOR DEVICE FOR PERFORMING THE TRANSMISSION OF A SIGNAL IN THE RELEVANT DEVICE BY MEANS OF AN OPTICAL INTERCONNECT

(75) Inventors: Shunpei Yamazaki, Tokyo (JP); Kiyoshi Kato, Kanagawa (JP); Yasuyuki Arai, Kanagawa (JP); Mai Akiba, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/428,158

(22) Filed: May 2, 2003

(65) Prior Publication Data

US 2004/0007706 A1 Jan. 15, 2004

(30) Foreign Application Priority Data

May 13, 2002 (JP) .................................... 2002-137495

(51) Int. Cl.
*H01L 29/16* (2006.01)
*H01L 29/267* (2006.01)
*H01L 29/26* (2006.01)

(52) U.S. Cl. .............................. 257/82; 257/80; 257/81
(58) Field of Classification Search ................. 257/80, 257/81, 82
See application file for complete search history.

(56) References Cited

U.S. PATENT DOCUMENTS

| | | | |
|---|---|---|---|
| 5,483,263 | A | 1/1996 | Bird et al. |
| 5,488,735 | A | 1/1996 | Tanabe et al. |
| 5,502,837 | A | 3/1996 | Hoffert |

(Continued)

FOREIGN PATENT DOCUMENTS

| | | |
|---|---|---|
| DE | 199 63 165 | 3/2001 |
| EP | 0 633 542 | 1/1995 |
| EP | 1 281 690 | 2/2003 |

(Continued)

OTHER PUBLICATIONS

European Search Report, EP 03 00 9851, dated Apr. 8, 2004.
Rogers, J. et al., *Organic Smart Pixels and Complementary Inverter Circuits Formed on Plastic Substrates by Casting and Rubber Stamping*, IEEE Electron Devices Letters, vol. 21, No. 3, Mar., 2000, pp. 100–103.

(Continued)

*Primary Examiner*—Ngân V. Ngô
(74) *Attorney, Agent, or Firm*—Eric J. Robinson; Robinson Intellectual Property Law Office, P.C.

(57) ABSTRACT

An object of the present invention is to provide a semiconductor device using a cheap glass substrate, capable of corresponding to the increase of the amount of information and further, having a high performance and an integrated circuit capable of operating at a high rate. A variety of circuits configuring an integrated circuit are formed on a plurality of glass substrates, the transmission of a signal between the respective glass substrates is performed by what is called an optical interconnect using an optical signal. Concretely, alight emitting element is provided on the output side of a circuit disposed on the upper stage formed on one glass substrate, and a photo-detecting element is formed so as to oppose to the relevant light emitting element on the input side of a circuit disposed on the rear stage formed on another glass substrate. Then, an optical signal converted from an electrical signal outputted from a circuit disposed on the upper stage is outputted from the light emitting element, the relevant optical signal is converted into an electrical signal by a photo-detecting element and inputted into a circuit disposed on the rear stage.

32 Claims, 15 Drawing Sheets

U.S. PATENT DOCUMENTS

| | | | |
|---|---|---|---|
| 5,705,829 | A | 1/1998 | Miyanaga et al. |
| 6,140,165 | A | 10/2000 | Zhang et al. |
| 6,730,933 | B1 * | 5/2004 | Shimizu et al. ............... 257/79 |
| 2003/0122137 | A1 * | 7/2003 | Hashimoto .................. 257/80 |
| 2003/0139520 | A1 | 7/2003 | Toyama et al. |
| 2003/0218174 | A1 * | 11/2003 | Verdonk et al. ............. 257/80 |
| 2004/0012016 | A1 | 1/2004 | Underwood et al. |
| 2004/0042707 | A1 | 3/2004 | Imai et al. |
| 2004/0061126 | A1 | 4/2004 | Imai et al. |
| 2004/0195572 | A1 | 10/2004 | Kato et al. |
| 2005/0006648 | A1 | 1/2005 | Yamazaki et al. |

FOREIGN PATENT DOCUMENTS

| | | |
|---|---|---|
| JP | 05-037357 | 2/1993 |
| JP | 09-246509 | 9/1997 |
| JP | 2000-058882 | 2/2000 |
| JP | 2000-277794 | 10/2000 |
| JP | 3397565 | 4/2003 |
| KR | 95-04420 | 4/1995 |
| WO | WO 01/33487 | 5/2001 |
| WO | WO 01/64598 | 9/2001 |
| WO | WO 02/31882 | 4/2002 |

OTHER PUBLICATIONS

Wu, C. et al., *Design of a Novel a–Si PIN/OLED Image Sensor & Display Device*, SID 99 Digest, 1999, pp. 528–531.

Search Report for Application No. 03009851.1 dated Jul. 1, 2004.

"Diffraction by a Periodic Structure,"(http://www.wias-berlin.de/+e,otl +ee schmidt./diffpage/index.html) by Dr. Gunter Schmidt, Weierstrass Institute, Berlin.

"Http://www.personal.psu.edu/mkm20/cca.html," by Marta K. Maurer, Ph.D., Pennsylvania State University.

* cited by examiner

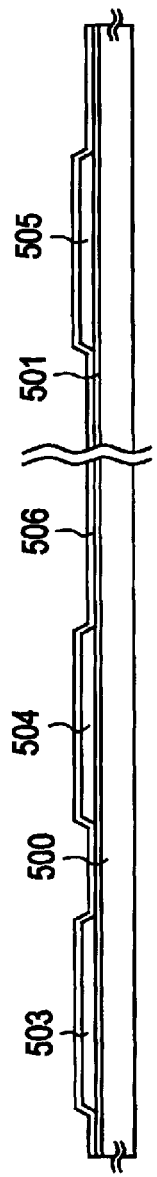
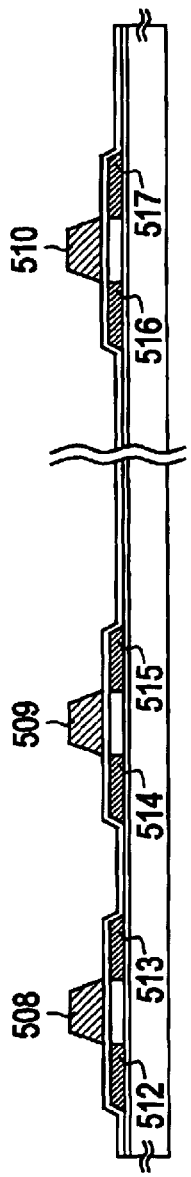
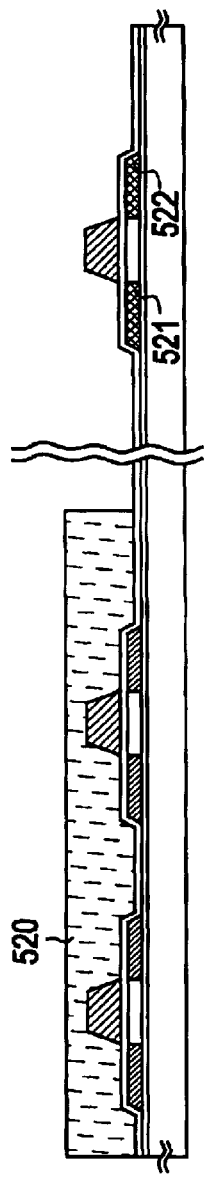
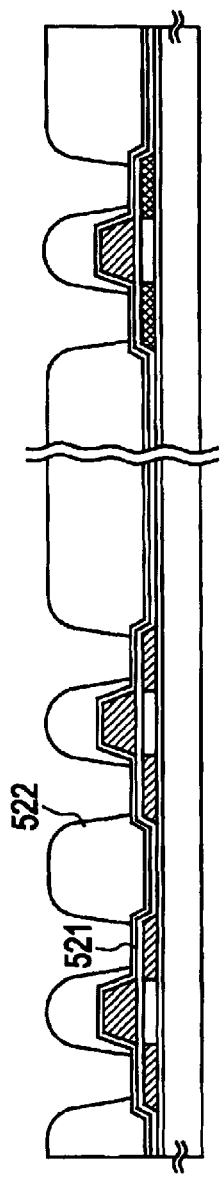

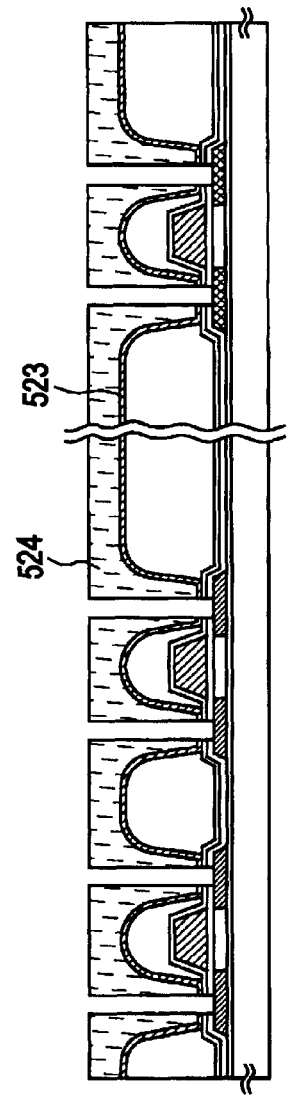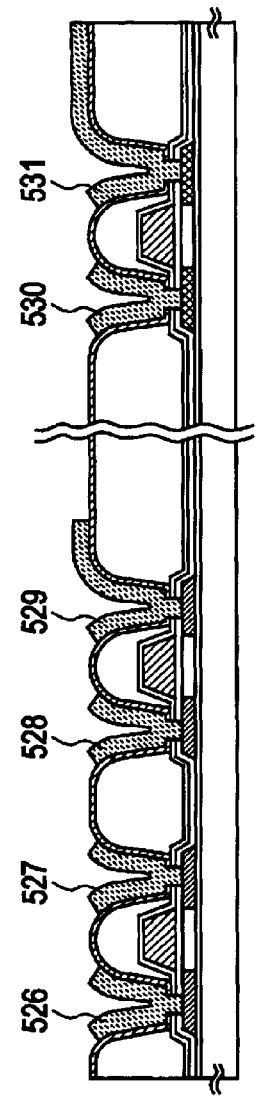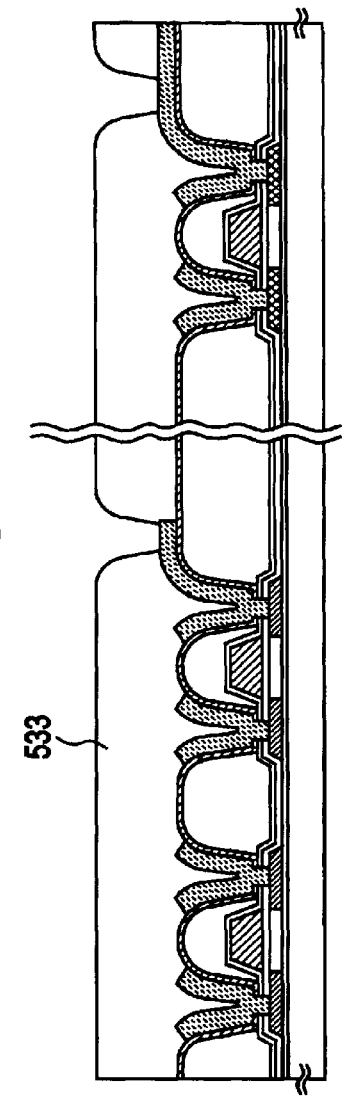

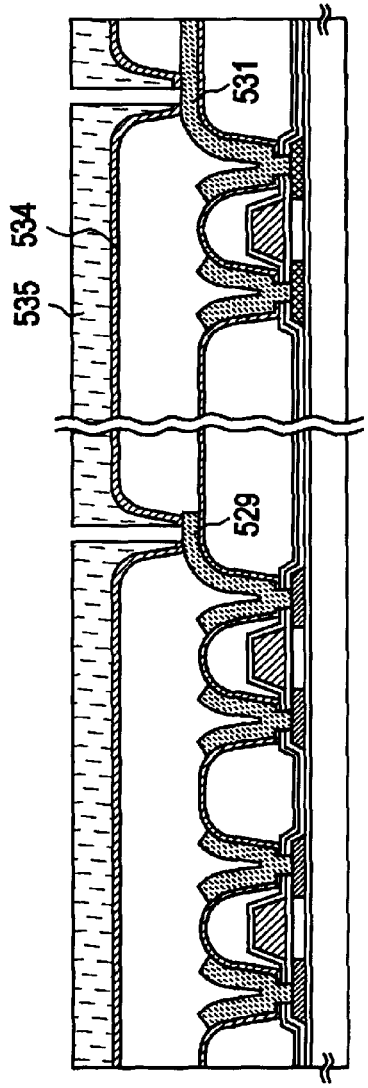
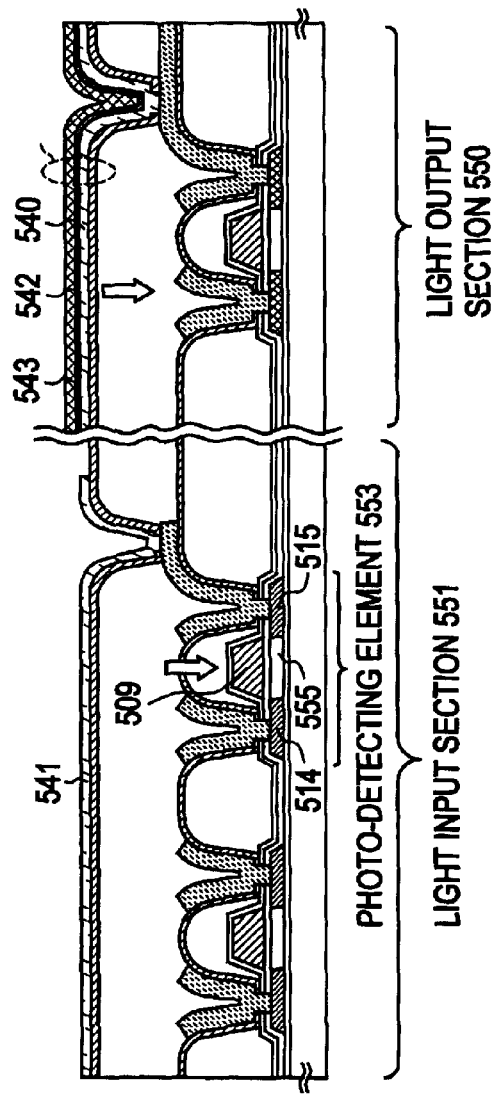

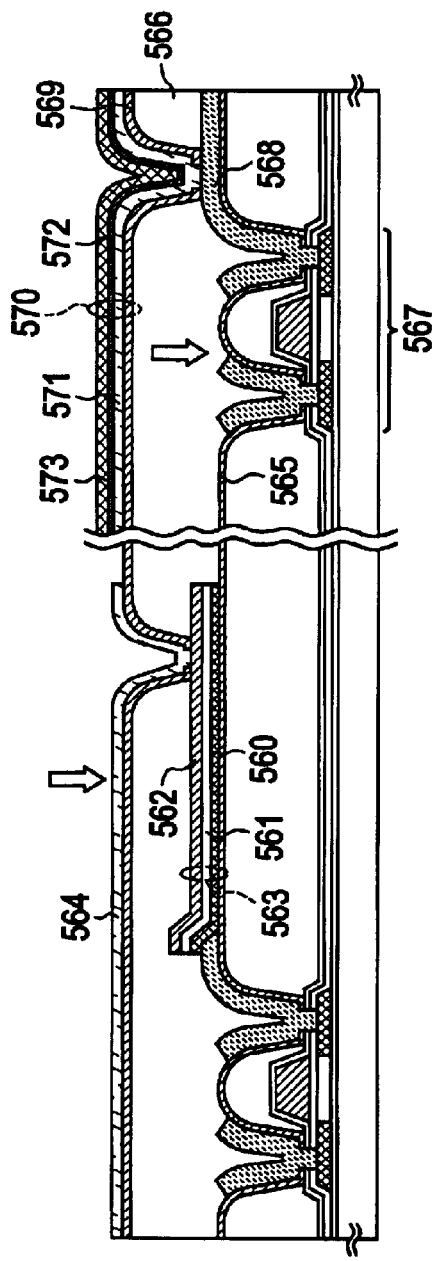
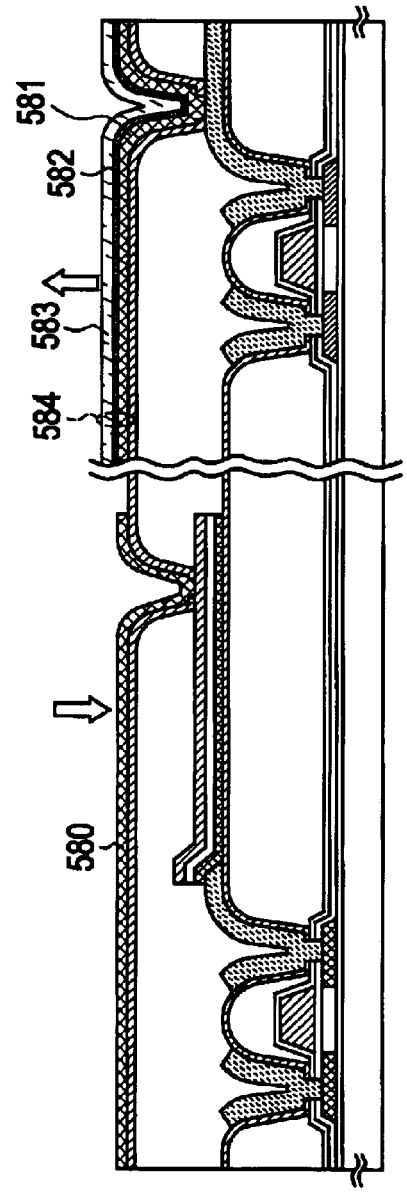

SEMICONDUCTOR DEVICE FOR PERFORMING THE TRANSMISSION OF A SIGNAL IN THE RELEVANT DEVICE BY MEANS OF AN OPTICAL INTERCONNECT

BACKGROUND OF THE INVENTION

1. Field of the Invention

The present invention relates to a semiconductor device configured with a semiconductor film having a crystal structure formed on a glass substrate, and more particularly, the present invention relates to a semiconductor device for performing the transmission of a signal in the relevant device by means of an optical interconnect.

2. Description of the Related Art

As for a thin film transistor (TFT) formed on an insulating substrate or an insulating film, it is characterized in that its fabricating method is easy comparing to that of a MOS (Metal Oxide Semiconductor) transistor formed on a silicon wafer and it can be fabricated at a low cost using a substrate having a large scale.

Particularly, as for a TFT (THIN FILM TRANSISTOR) (in this case, polycrystalline TFT) whose active layer is formed with a polycrystalline silicon film, since its mobility is larger comparing to a TFT using an amorphous silicon, it is desirable to consider its applications in a wider range of functional devices including not only display devices and photoelectric conversion elements but also the field of integrated circuits.

However, after all, electric characteristics of a polycrystalline TFT have not been comparable to the characteristics of a MOS transistor (single crystal transistor) formed on a single crystal silicon wafer. Particularly, from the viewpoints of ON-state current and mobility, a polycrystalline TFT has been inferior to a single crystal transistor due to the existence of the defaults in the grain boundary when these were compared. Therefore, in case where the preparation of an integrated circuit was attempted using a polycrystalline TFT, the size of a TFT could not be suppressed when a sufficient ON-state current was attempted to obtain. Furthermore, it was difficult to depict a fine pattern on a glass substrate having a large scale at a high rate, and these matters have created a bottleneck in the realization of higher level integration of an integrated circuit.

SUMMARY OF THE INVENTION

In the case where a sufficient higher level integration is not realized in an integrated circuit, the wirings connecting the respective elements become longer and the wiring resistance is heightened. When the wiring resistance is heightened, the delay of a signal and turbulence of waveforms occur, the amount of transmission of signals lowers, the performance of the information processing of the relevant integrated circuit becomes restricted, hindering the realization of an integrated circuit which is capable of being operated at a high rate with a high performance. Moreover, the parasitic capacitance between the wirings increases accompanied with the elongation of the wirings, and the charging and discharging energies to the wirings and the amount of consuming electric power also increases.

Moreover, an integral formation of a variety of semiconductor circuits on one piece of glass substrate becomes a factor that causes the yield to be lower. Furthermore, since an integrated circuit is configured with circuits having a variety of functions, it is naturally estimated that there would be differences between the performances of TFTs required for the respective circuits. Then, when an attempt is made, in order to obtain the desired performance, to optimize the configuration of a TFT for each circuit disposed on the same substrate, the process becomes complicated, the number of processes further increases, lowering the yield and making it difficult to shorten the time required for completing the product (i.e., TAT: Turn Around Time).

In reverse, when semiconductors formed on a plurality of substrates are electrically connected to each other using FPC (Flexible Printed circuit) or the like, since the portion connecting is weak for physical impact, the reliability in the mechanical strength is lowered. Moreover, when the connections are made using FPC or the like, the more the amount of information of signals that the semiconductor device processes increases, the more the number of the connecting terminals increases, and raises the occurrence probability of the contact failures.

Then, when the number of connecting terminals increases because of the further increase in amount of information that the semiconductor device processes, there might occur situations where the connecting terminals can no longer be disposed at the edge portion of the substrate. However, it is not desirable to enlarge the area of the substrate only for the purpose of securing the disposition place of the connecting terminals because it also becomes a factor of hindering the miniaturization of the semiconductor device.

An object of the present invention is to provide a semiconductor device having an integrated circuit using a cheap glass substrate capable of corresponding to the increase of the amount of information and further having a high performance and capable of operating at a high rate.

In the present invention, in order to solve the problems described above, a variety of circuits configuring an integrated circuit are formed on a plurality of glass substrates, and the transmission of signals between the respective glass substrates is performed by means of what is called an optical interconnect using an optical signal.

Concretely, a light emitting element is provided on the output side of a circuit of the upper stage formed on a certain glass substrate, and a photo-detecting element is formed so as to be opposed to the relevant light emitting element on the input side of a circuit of the rear stage formed on the another glass substrate. Then, an optical signal which has been converted from an electrical signal outputted from the circuit disposed on the upper stage is outputted from the light emitting element, the relevant optical signal is converted into an electrical signal and it is inputted into a circuit disposed on the rear stage.

In this way, by utilizing an optical interconnect, data transmission can be performed between the glass substrates. Moreover, when glass substrates on which photo-detecting elements are provided are further laminated, the signal from one light emitting element can be received by a plurality of photo-detecting elements. Specifically, the transmission can be performed from one glass substrate to the other plurality of glass substrates at the same time, and an optical bus with a very high rate can be formed.

Then, since a glass substrate, unlike a single crystal silicon wafer, transmits the light, the transmission of signals between 3 sheets of glass substrates or more is possible comparatively easily. Then, as described above, the operation rate of the TFT formed on the glass substrate is low compared to that of a single crystal transistor. However, since the width of bus of a signal which is transmitted between the substrates can be taken large, and the parallel operation of circuits disposed on a plurality of glass substrates can be performed with excellent efficiency, the low operation rate of the TFT formed on the glass substrate when compared to that of a single crystal transistor can be made up for.

Moreover, even if the degree of integration of the circuit formed on the glass substrate is low compared to that of a single crystal silicon wafer, since a plurality of glass substrates can be laminated by utilizing an optical signal for transmitting a signal between the substrates, it can prevent the device from being bulky in the horizontal direction. Furthermore, it can prevent the wirings from being too long, helping suppress the electric power consumption increase due to the wiring capacitance.

Moreover, when the process is changed per each substrate, since the configuration of the TFT of each circuit can be easily optimized, the increase of the number of steps per each sheet of substrate can be suppressed when optimizing, and the time required for completing the product (i.e., TAT: Turn Around Time) can be suppressed. Moreover, the cost can be suppressed by utilizing a cheap glass substrate, and fabrication by a simple method is possible.

Then, since one integrated circuit is configured by combining the circuits formed on the respective substrates, the yield can be enhanced comparing to the case where an integrated circuit is formed on one substrate. Moreover, the number of terminals such as FPC or the like for the purpose of electrically connecting between the circuits can be suppressed by utilizing an optical signal for transmitting a signal between the substrates, and the reliability in the mechanical strength can be enhanced. Furthermore, even if the amount of information of the signals to be processed is increased, the lowering of the yield due to the occurrence of contact failures in the portion of the terminal can be suppressed.

Then, as for a light emitting element and a photo-detecting element for performing the sending and receiving of an optical signal, which is different from a terminal of a FPC, since these are not necessarily disposed at the edge portions of the substrate, the limitation on the layout becomes smaller, and these easily correspond to the further increase of the amount of information to be processed.

In this way, the present invention enables to provide a semiconductor device having an integrated circuit having a high performance and capable of operating at a high rate.

BRIEF DESCRIPTION ON THE DRAWINGS

FIG. 10 is a diagram showing the steps of fabricating a semiconductor device of the present invention;

FIG. 11 is a diagram showing the steps of fabricating a semiconductor device of the present invention;

FIG. 12 is a diagram showing the steps of fabricating a semiconductor device of the present invention;

FIG. 13 is a diagram showing the steps of fabricating a semiconductor device of the present invention;

PREFERRED EMBODIMENTS OF THE INVENTION

Hereinafter, the configuration of a semiconductor device of the present invention will be described in detail.

Figure 1A:
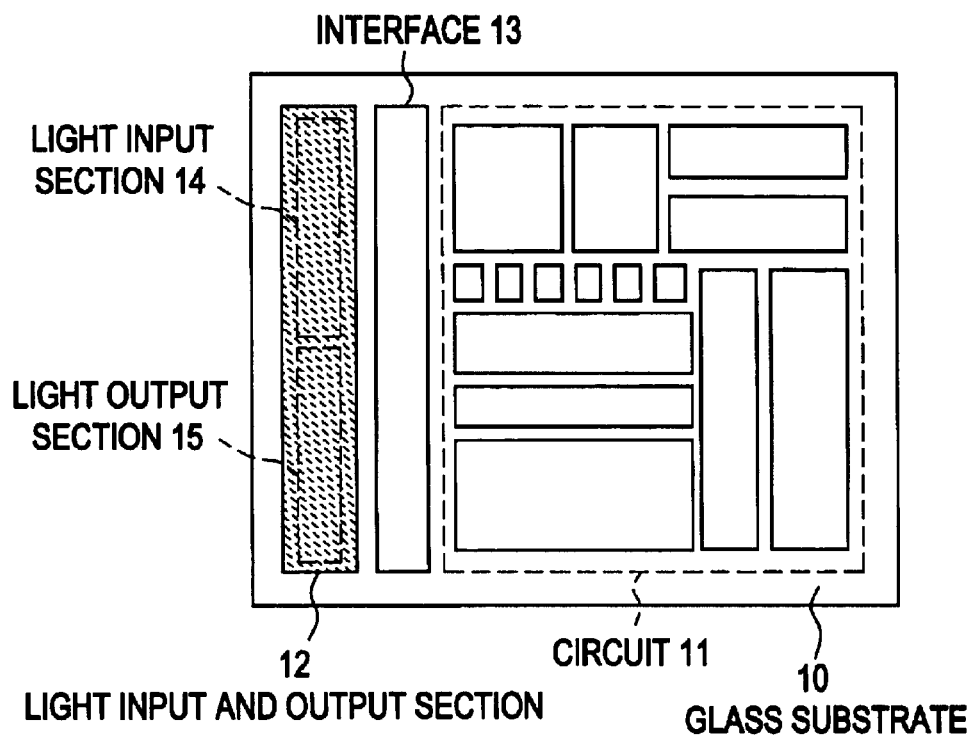
FIG. 1 is a diagram showing a configuration of a glass substrate having a light input and output section.

In FIG. 1A, the configuration of a glass substrate that a semiconductor device of the present invention has is shown as an example. In FIG. 1A, on a glass substrate 10, one or a plurality of circuits 11 which have been formed with semiconductor elements were formed. Furthermore, on the glass substrate 10, it has a light input and output section 12 for performing the sending and receiving an optical signal and an interface 13 which processes an electrical signal inputted into and outputted from the relevant light input and output section 12.

The light input and output section 12 has a light input section 14 in which a photo-detecting element for receiving an optical signal has been formed and a light output section 15 in which a light emitting element for sending an optical signal has been formed. In FIG. 1A, for the purpose of easily illustrating it, the light input section 14 and the light output section 15 are shown by making the areas where these are disposed different, however, an element having a function for receiving an optical signal and an element having a function for sending an optical signal may be mixed.

Moreover, in FIG. 1A, the case where the sending and receiving of a signal between the other substrate and it is performed only by an optical signal is shown, however, one portion of the signals may be sent and received as the electrical signal is, or it may have a function for sending and receiving the signal as the electrical signal is, for example, such as a terminal or the like.

Figure 1B:
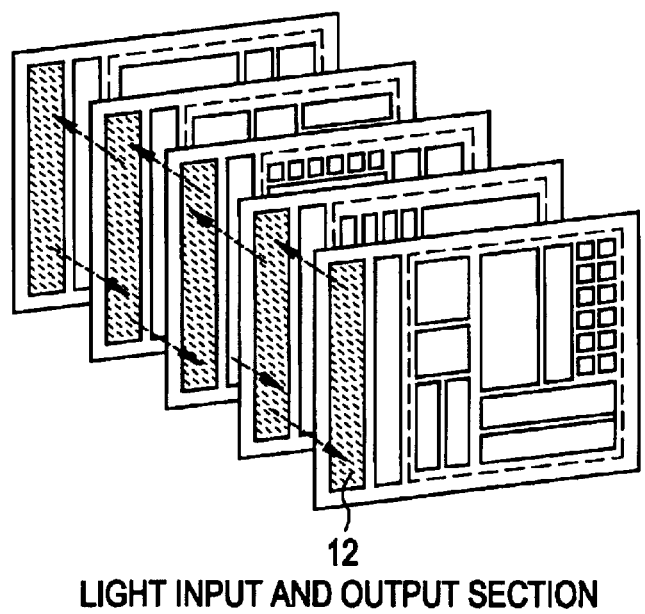

In FIG. 1B, the way in which glass substrates shown in FIG. 1A are superimposed with one another, and the way in which optical signal is sent and received between the respective substrates are shown. The light input and output sections 12 are superimposed with each other, which are disposed on the respective substrates, and an integrated circuit comprising the circuits 11 formed on the respective glass substrates 10 is constructed by performing the sending and receiving of an optical signal between the respective substrates.

Figure 2A:
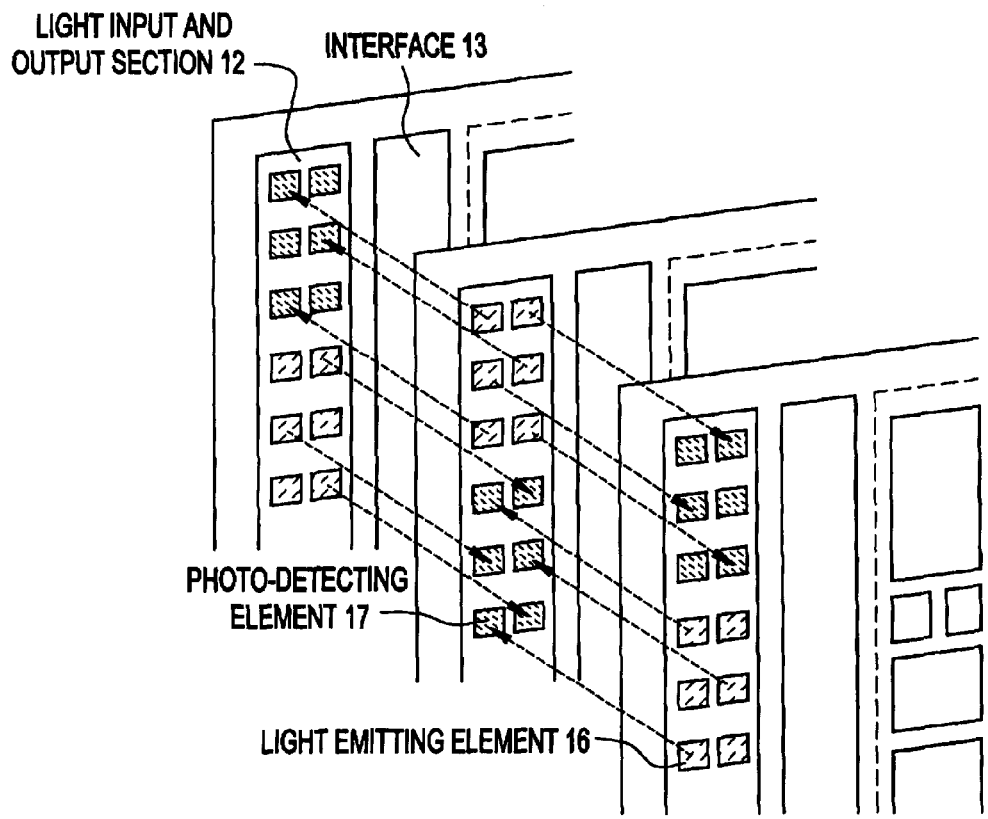
FIG. 2 is a diagram showing a configuration of a light input and output section.

In FIG. 2A, a more concrete configuration of the light input and output section 12 is shown. In FIG. 2A, the way in which at least one photo-detecting element 17 corresponds to one light emitting element 16 between the substrates is shown. As for the light emitting element, it is desirable that it can be formed on the glass substrate and further it is an element capable of obtaining a luminescence having a directivity.

It should be noted that in FIG. 2A, only the light emitting element 16 and the photo-detecting element 17 are shown at the light input and output section 12, however, actually, a drive section for making the light emitting element emit using an electrical signal, a circuit for amplifying an electrical signal obtained from the photo-detecting element and a circuit for correcting the waveform of the obtained electrical signal are provided. Noted that an interface 13 might be equipped with these functions.

Figure 2B:
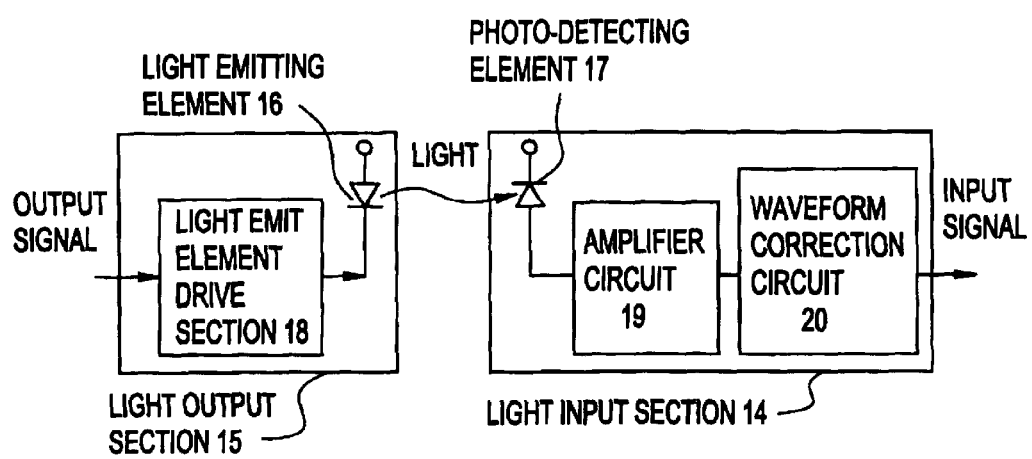

In FIG. 2B, concrete configurations of the light input section 14 and the light output section 15 are shown. The light output section 15 has the light emitting element 16 and a light emitting element drive section 18 for making the relevant light emitting element 16 emit by utilizing an electrical signal (output signal) outputted from the interface 13. The concrete configuration of the light emitting element drive section 18 can be appropriately determined in accordance with the configuration of the light emitting element 16.

The light input section 14 has the photo-detecting element 17, an amplifier circuit 19 for amplifying an electrical signal obtained at the relevant photo-detecting element 17, and a waveform correction circuit 20 for correcting the waveform of the electrical signal. It should be noted that the amplifier circuit 19 and the waveform correction circuit 20 are not necessarily required to provide, and then, except for these circuits, the light input section 14 might have a circuit for processing something to the waveform of the electrical signal. In FIG. 2B, an electrical signal outputted from the waveform correction circuit 20 is inputted from the interface 13.

It should be noted that although in FIG. 2A, an example in which a light emitting element corresponds to a photo-detecting element in a one-to-one manner, the present invention is not limited to this configuration. Two light emitting elements or more may correspond to one photo-detecting element, or one light emitting element may correspond to two photo-detecting elements or more.

Figure 3A:
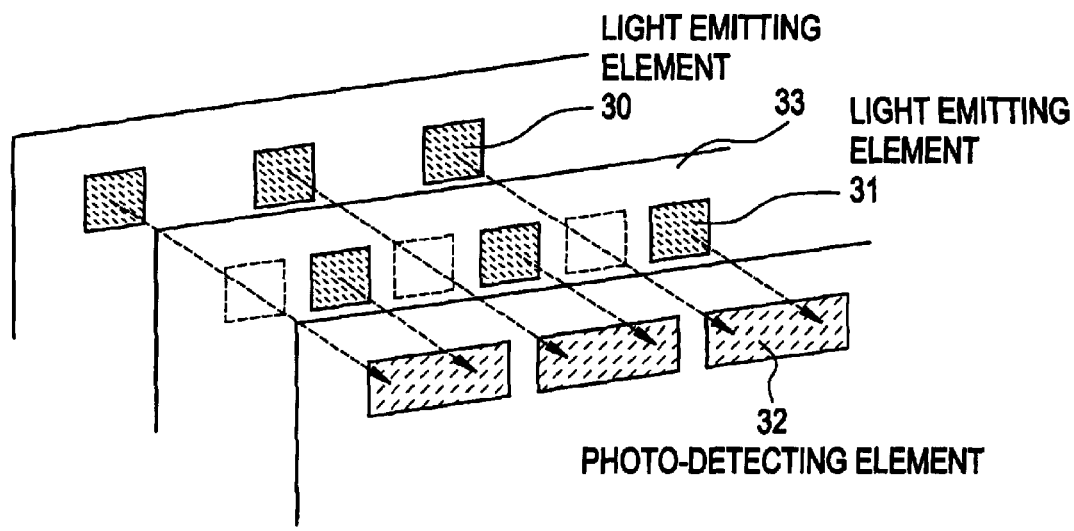
FIG. 3 is a diagram showing the corresponding relationship between a light emitting element and a photo-detecting element.

In FIG. 3A, the way in which two light emitting elements formed on the respective substrates different from each other correspond to one photo-detecting element formed on the still other substrate is shown. A light emitting element 30 is disposed so that the emitted light transmits through a glass substrate 33 on which a light emitting element 31 has been formed and the emitted light is incident into the photo-detecting element 32. By means of the above-described configuration, an other operation can be performed on the substrate on which the light emitting element 31 has been formed during the time that an optical signal is sent from the light emitting element 30 to the photo-detecting element 32, and in reverse, another operation can be performed on the substrate on which the light emitting element 30 has been formed during the time that an optical signal is sent from the light emitting element 31 to the light photo-detecting element 32.

In reverse, in the case where two photo-detecting elements formed on the respective substrates which are different from each other correspond to one light emitting element formed on the still other substrate, an optional signal can be sent to a plurality of substrates at the same time.

Figure 3B:
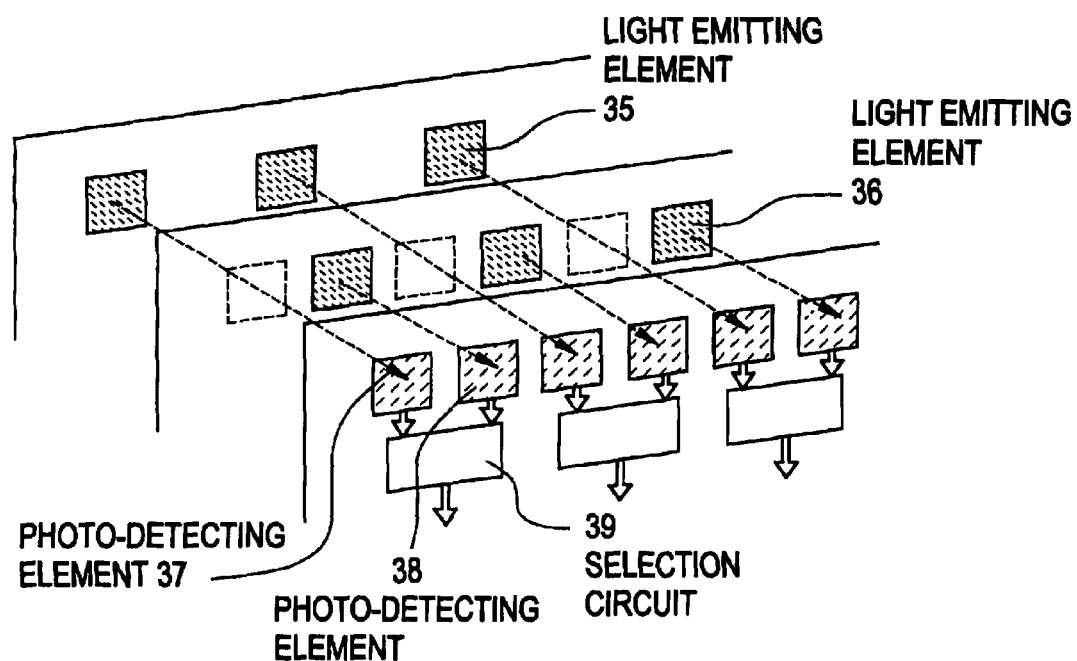

Moreover, in FIG. 3B, the case where any one of the electrical signals obtained at a plurality of photo-detecting elements is selected, for example, a selection circuit having a function for sending it to the other circuits within the light input section such as an amplifier circuit or the like and to an interface is provided is shown. In FIG. 3B, optical signals emitted from two light emitting elements 35, 36 formed on the respective substrates which are different from each other are converted into electrical signals in two photo-detecting elements 37, 38 formed on the still other substrates. Then, either of two electrical signals to be obtained is selected in a selection circuit 39, and sent to the circuit of the rear stage. By means of the above-described configuration, similar to the case of FIG. 3A, an oscillation frequency per one light emitting element can be lowered, and the burden of the light emitting element drive section for controlling the drive of the light emitting element can be reduced.

It should be noted that in order to perform the parallel transmission of data using optical signals between the glass substrates, it is necessary that the pathways of the optical signals are made independent, respectively. However, depending upon the degree of the light diffusion, there may be some cases where what is called a crosstalk that an optical signal is incident into a photo-detecting element to which the optical signal does not correspond. The degree of light diffusion is dependent upon the directivity of the light emitted from the light emitting element and refractive index of the medium in the pathway of an optical signal. Hence, it is desirable to consider the light diffusion so that the crosstalk is suppressed as much as possible, layout a photo-detecting element and a light emitting element in accordance with the directivity of the light of the light emitting element to be used, and appropriately set the thickness of substrates, the distance between the substrates, the medium between the substrates and the like. Moreover, in order to prevent the crosstalk, an optical fiber having a cylindrically shaped cross section or a cross section similar to that cross section is provided on the pathway of an optical signal, and optical waveguide such as a thin film waveguide and the like for transmitting the light along the planar dielectric thin film may be provided.

It should be noted that substrates used in the present invention are not limited to glass substrates. If these have a transparency and are substrates capable of being bearable to the processing temperature in the formation of a semiconductor element or the other processes, it is also naturally possible that substrates except for glass substrates such as plastic substrates or the like are also used.

EXAMPLES

Hereinafter, Examples of the present invention will be described.

Example 1

In the present Example, an example in which CPU cores of CPU (Central Processing Unit) represented by a microprocessor are formed on a plurality of glass substrates and the respective substrates are connected to an optical interconnect will be described below.

A TFT formed on a glass substrate is slow at the operation rate when comparing to a single crystal transistor. Therefore, in the case where a CPU is formed on the glass substrate, when the process contents become complex, it is difficult for a single CPU core to carry out the processing at a sufficient rate. Then, a series of processing steps of the CPU cores are divided into some processing steps per each purpose, a CPU core formed on one substrate is assigned to each processing step. Then, a series of processing steps can be performed as similar to the case where a single CPU core was used by connecting a plurality of substrates on which each CPU core has been formed by means of an optical interconnect. It is sufficient that the CPU cores formed on the respective substrates may perform the processing step assigned to these, the processing rate is enhanced when comparing to the case where all the processing steps are performed by a single CPU core.

Figure 4:
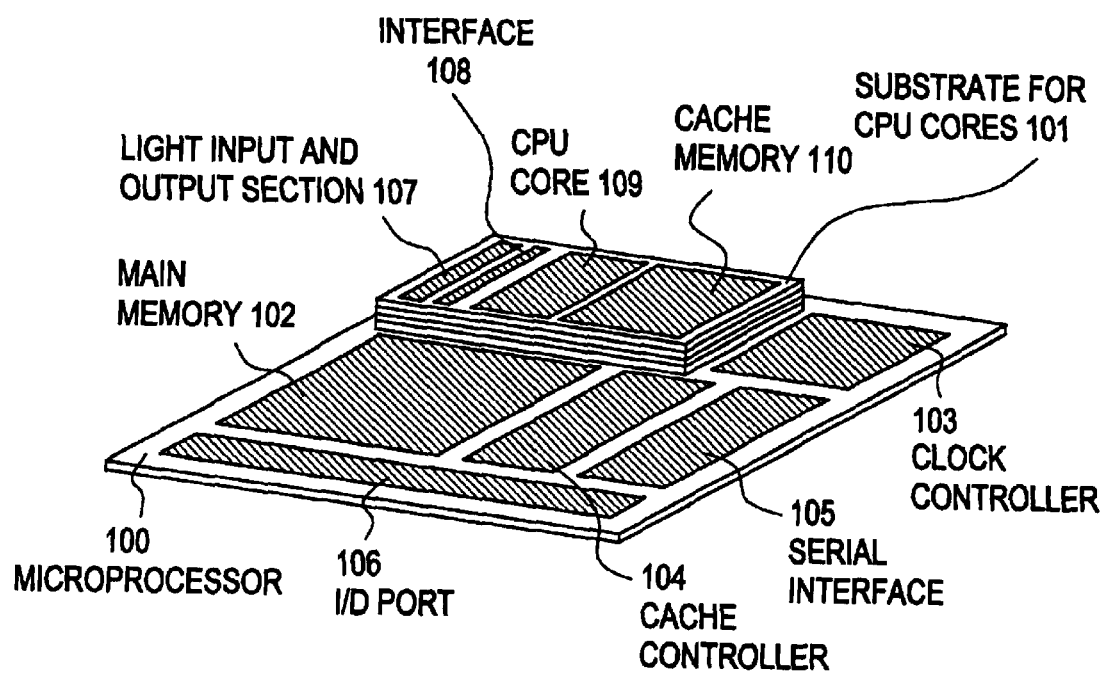
FIG. 4 is a diagram showing s configuration of a microprocessor of the present invention.

In FIG. 4, a perspective view of a microprocessor of the present Example is shown. A microprocessor 100 is configured with a substrate 101 used for a plurality of CPU cores using a glass substrate, a main memory 102, a clock controller 103, a cache controller 104, a serial interface 105, I/O port 106 and the like. Needless to say, the microprocessor shown in FIG. 4 is a simplified example, an actual microprocessor has a wide variety of configurations in accordance with its uses.

The substrate 101 used for CPU cores is formed with a substrate having a transparency, and in the present Example, a glass substrate is used. Then, the substrate 101 used for CPU cores has a light input and output section 107, an interface 108, a CPU core 109, and a cache memory 110, respectively.

It should be noted that the light input and output section 107 might have both of an element having a function for outputting an electrical signal as an optical signal and an element having a function for converting an optical signal into an electrical signal, and it might have only one of these depending upon its substrate. Then, it may have a terminal for sending and receiving an electrical signal as it is without converting into an optical signal between it and the other circuits configuring the microprocessor 100.

The cache memory 110 is a memory intervening between the CPU core 109 and the main memory 102, which has a small capacitance and operates at a high rate. A CPU core capable of operating at a high rate requires a memory capable of operating at a high rate. However, in the case where a memory having a large amount of capacitance and access time corresponding to the operation rate of the CPU core and operating at a high rate is used, generally speaking, its cost becomes higher. The CPU core is capable of operating at a high rate without depending upon the speed of the main memory by accessing to the cache memory.

Hereinafter, an example of the operations of the respective CPU cores 109 will be described.

For example, first, at initial run time, the program is downloaded into the cache memory 110 (SRAM) of the substrate 101 used for the respective CPU cores from the main memory 102 or the other memories externally equipped. It may be performed by the CPU cores 109 to be the master.

Next, the respective CPU cores 109 to be the slave in turn execute the programs stored at the cache memory 110 of the substrate 101 used for the same CPU cores. The cache memory 110 of the substrate 101 used for the same CPU cores not only stores the programs, but also functions as a work region, and calculation results and the like of the CPU cores 109 are temporarily stored.

When the respective CPU cores 109 require the communication using a signal for the output results of the other CPU cores 109 and require the communication using a signal with main memories such as the cache memory 110 within the substrate used for the CPU cores, these procedures are performed via the light input and output section 107.

The operation rate as a whole is enhanced in accordance with the number of the CPU cores 109. Particularly, in the case where the number of communications of signals between the CPU cores 109 and signals to the external of the substrate 101 used for the CPU cores is small, the effect of parallelization is enhanced.

As an example of programs, for example, in the optimizing problem (e.g., the problem of automatic wiring, the problem of the way in which a salesman goes around) such that the minimum value is attempted to find out within a phase apace having a very large number of minimal values, and the evaluation of variation (circuit simulation and the like), the cases where methods such as Monte Carlo method, simulated annealing method and the like are applied are listed.

These programs fundamentally and independently have structures for executing the same subprogram a plurality of times, the completed program can be substantially executed with the CPU cores 109 within the substrate 101 used for the respective CPU cores and the cache memory 110 by making the different CPU cores 109 account for the respective subprograms, and an ideal parallel computation is capable of being performed.

It should be noted that since there might be some cases where the inconvenience occurs when viewing the processing as a whole when the processing rate between the CPU cores varies, the balance of the processing rates between the respective CPU cores to be the slave might be adjusted by means of the CPU cores to be the master.

Example 2

In the present Example, one Example of a semiconductor display device, which is one of semiconductor devices of the present invention, will be described below.

Figure 5:
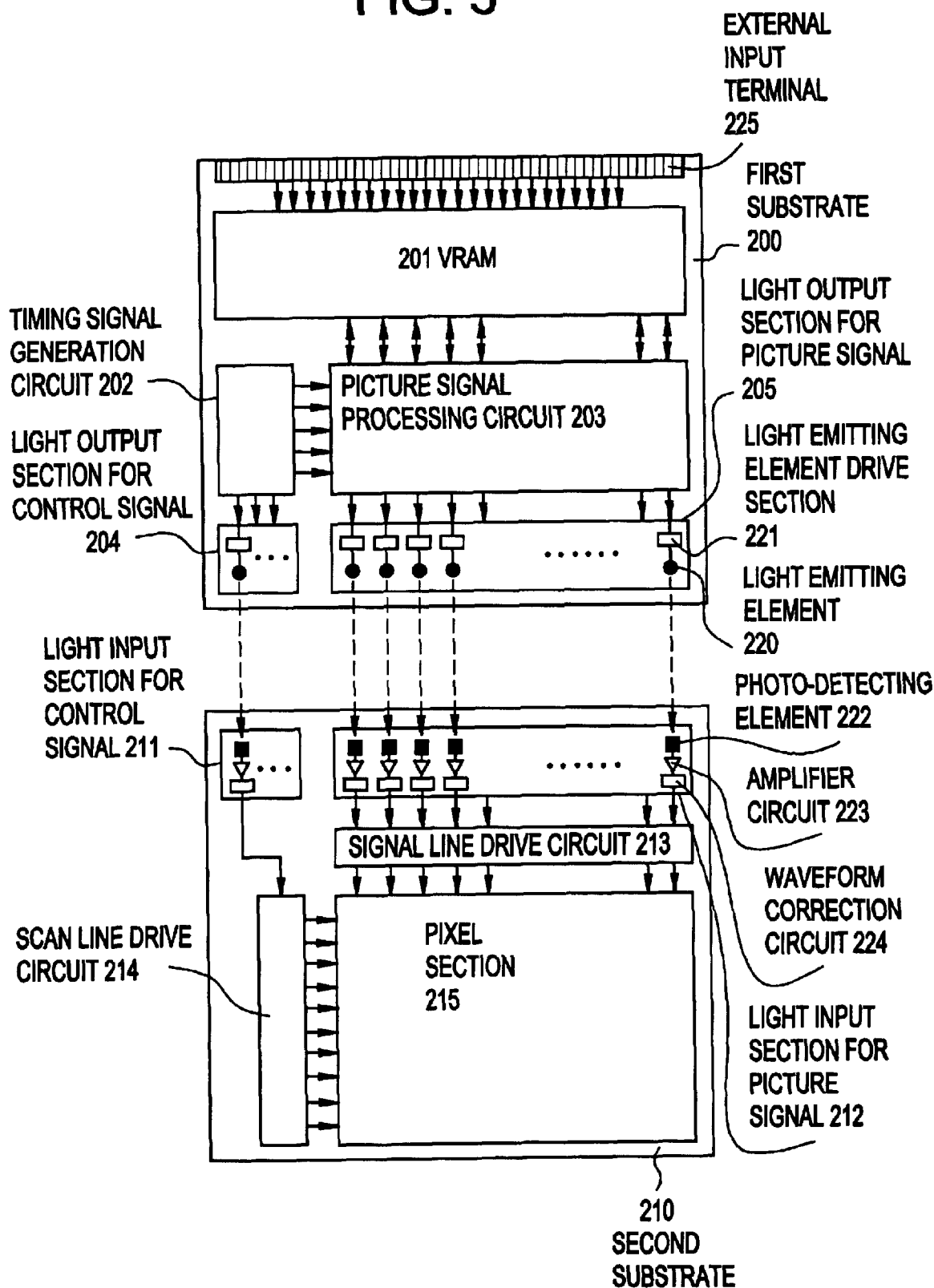
FIG. 5 is a block diagram showing a configuration of a semiconductor display device of the present invention.

In FIG. 5, the configuration of a semiconductor display device of the present Example is shown as a block diagram. In FIG. 5, two sheets of glass substrates are used, on a first substrate 200, an external input terminal 225, a VRAM (Video Random Access Memory) 201, a timing signal generation circuit 202, a picture signal processing circuit 203, a light output section for control signal 204 and a light output section for picture signal 205 have been are provided.

One or a plurality of light emitting elements 220 and a light emitting element drive section 221 corresponding to one or a plurality of light emitting elements 220 are formed at the light output section for control signal 204 and the light output section for picture signal 205, respectively. It should be noted that one of the light emitting element drive sections 221 might correspond to a plurality of the light emitting elements 220, or the light emitting element drive section 221 might correspond to the light emitting element drive section 221 in a one-to-one manner.

Moreover, on a second substrate 210, a light input section for control signal 211, a light input section for picture signal 212, a signal line drive circuit 213, a scan line drive circuit 214 and a pixel section 215 have been provided.

One or a plurality of photo-detecting elements 222 and an amplifier circuit 223 and a waveform correction circuit 224 corresponding to the photo-detecting elements 222 have been formed at the light input section for control signal 211 and the light input section for picture signal 212, respectively.

Data having image information inputted from an external input terminal 225 has been memorized at the VRAM 201, then, in the picture signal processing circuit 203, a certain processing is added to the relevant data in accordance with the standard of the signal line drive circuit 213, and it is sent to the picture signal output section 205 as a picture signal. At the light emitting element drive section 221 of the picture signal output section 205, the luminescence of the light emitting element 220 is controlled using the picture signal which has been sent.

On the other hand, in the timing signal generation circuit, signals such as a clock signal (CLK), a start pulse signal (SP), a latch signal and the like for controlling the timing of the drive of the picture signal processing circuit 203, the signal line drive circuit 213 and the scan line drive circuit 214 are generated. Signals for controlling the drive of the picture signal processing circuit 203 are directly given to the relevant circuits, however, a signal given to the circuits formed on the second substrate 210 where these circuits are the signal line drive circuit 213 and the scan line drive circuit 214 is converted into an optical signal at the light output section for control signal 204, and it is converted again into an electrical signal at the light input section for control signal 211. Then, a variety of control signals converted into an electrical signal are given to the signal line drive circuit 213 and the scan line drive circuit 214.

The signal line drive circuit 213 drives in synchronization with the timing of the given control signal and performs the sampling of a picture signal and inputs it into the pixel section 215. Moreover, the scan line drive circuit 214 also is operated in synchronization with the inputted control signal, and it controls the timing at which the picture signal is inputted into the respective pixels of the pixel section 215.

It should be noted that although in the present Example, data having image information are transmitted as an electrical signal via the external input terminal 225, it might be transmitted as an optical signal, not as an electrical signal.

In FIG. 6, the concrete configuration of a signal line drive circuit, a scan line drive circuit and a pixel section of an active matrix type semiconductor display device used in Example is shown. It should be noted that in FIG. 6, the case where an OLED (OLED: Organic Light Emitting Device) is used as a light emitting element which is one of elements for displaying an image at the pixel section is shown.

Figure 6A:
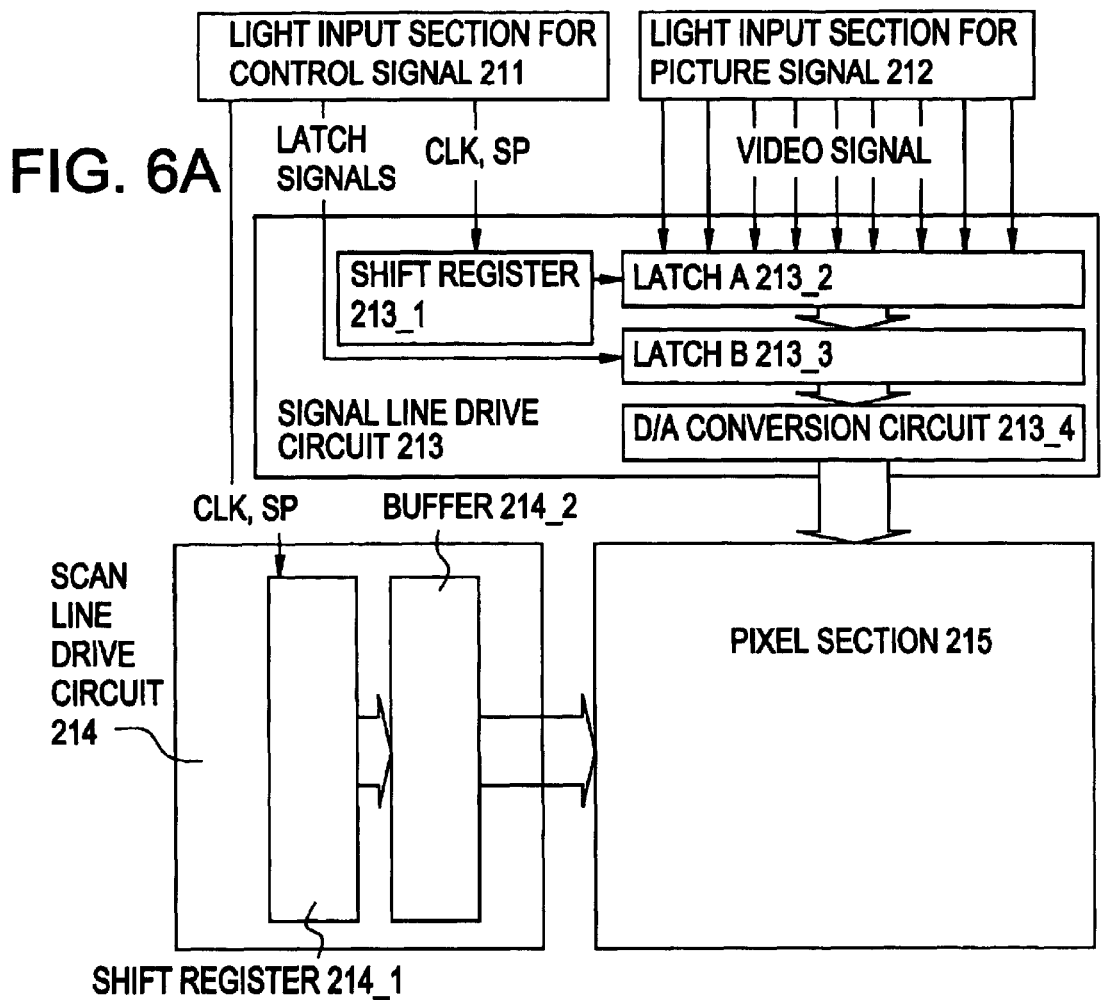
FIG. 6 is a diagram showing a configuration of a signal line drive circuit, a scan line drive circuit and a pixel section.

In FIG. 6A, the signal line drive circuit 213 has a shift register 213_1, a latch A213_2, a latch B213_3 and D/A conversion circuit 213_4. The shift register 213_1 in turn generates timing signals based on the inputted clock signal (CLK) and start pulse (SP), and in turn supplies the timing signal to the circuits of the rear stages.

It should be noted that the timing signal from the shift register 213_1 might be buffered and amplified by means of a buffer or the like (not shown) and might in turn supply the timing signal which has been buffered and amplified to the circuits of the rear stages. Since many circuits or elements are connected to the wirings to which the timing signals are supplied, the load capacitances (parasitic capacitances) are large. In order to prevent the timing signals occurring due to the largeness of these load capacitances from being "less capable" of rise or fall, this buffer is provided.

A timing signal from the shift register 213_1 is supplied to the latch A213_2. The latch A213_2 has a latch of a plurality of stages in which a picture signal of digital is processed. When the foregoing timing signal is inputted into the latch A213_2, and at the same time, picture signals are in turn written and maintained.

It should be noted that when picture signals are incorporated into the latch A213_2, picture signals are in turn inputted into the latch of a plurality of stages which the latch A213_2 has.

The time required for the writing of picture signals into the latches of the all stages of the latch A213_2 being terminated in a general way is referred to as a line period. Specifically, the time interval from the time point at which the writing of the picture signals into the latch of the stage of the farthest end of the left side is initiated in the latch A213_2 to the time point at which the writing of the picture signals into the latch of the stage of the farthest end of the right side is terminated in the latch A213_2 is a line period. Actually, a period in which the horizontal return period is added to the above-described line period may be included in a line period.

When one line period is terminated, a latch signal is supplied to the latch B213_3. At this instance, the picture signals written and maintained at the latch A213_2 are all together sent out to the latch B213_3, and written into the latches of all the stages of the latch B213_3 and maintained.

The latch A213_2 that has terminated the sending of the picture signals into the latch B213_3 in turn performs the writing of the picture signals again based on the timing signal outputted from the shift register 213_1.

During one line period of this second turnaround, the picture signal written and maintained at the latch B213_3 is converted into an analog signal in a D/A conversion circuit 213_4, and it is inputted into a signal line provided in the pixel section 215.

It should be noted that the D/A conversion circuit 213_4 is not necessarily required to use, in the case where time division gradation is performed, a picture signal of digital is inputted into a signal line provided in the pixel section 215 as it is without utilizing the D/A conversion circuit 213_4.

It should be noted that since the bus width of an optical signal at the light input and output section can be largely spaced, it is also possible that the number of input signals at the light input section is made the same with the number of the signal line of one line portion. In this case, even if the latches are not in turn selected using a timing signal and not written into these, since the writing to the latches of all the stages can be performed at once, the drive is possible even if the shift register is not used. Moreover, even if the number of input signals at the light input section does not correspond to the number of the total signal lines of one line portion, since anyway, the bus width of an optical signal at the light input and output section can be largely spaced, the drive frequency of the signal line drive circuit can be sufficiently reduced comparing to the drive frequency when the terminal is used.

Moreover, in the case where the number of input singles at the light input section is the same with the number of the signal lines of one line portion, the drive is possible without providing the latch B.

On the other hand, the scan line drive circuit 214 has a shift register 214_1 and a buffer 214_2, respectively. Moreover, depending upon the cases, it may have further a level shifter.

In the scan line drive circuit 214, a selection signal outputted from the shift register 214_1 is supplied to a buffer (not shown), and it is supplied to the corresponding scan line.

Figure 6B:
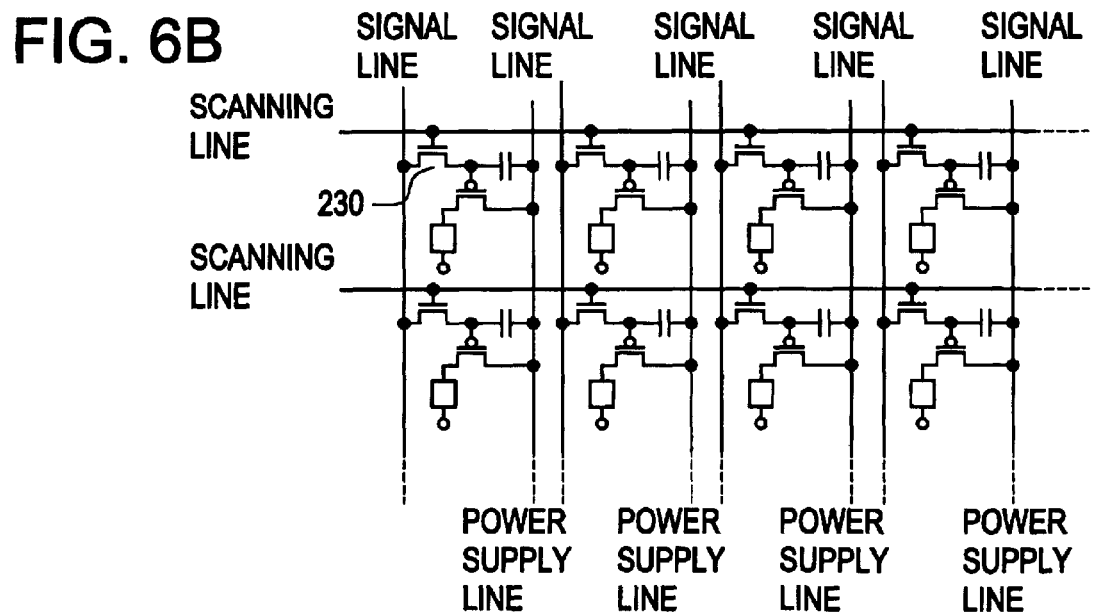

In FIG. 6B, one portion of the pixel section is shown. Gates of TFTs 230 of the pixels of one line portions of have been connected to the respective scan lines. Then, since TFTs 230 of the pixels of one line portions have to be turned ON all at once, as for a buffer 214_2, a buffer capable of allowing a large amount of current to flow is used.

Figure 7A:
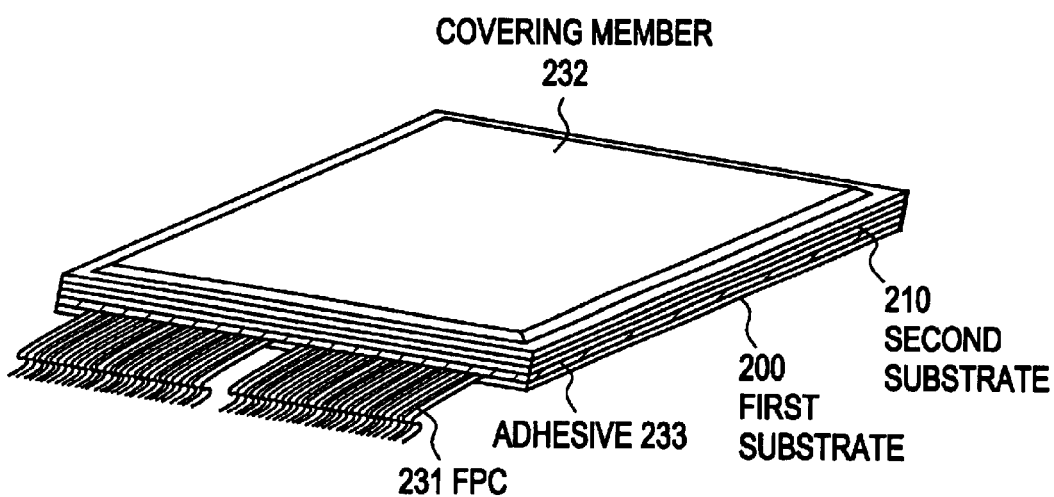
FIG. 7 are a perspective view and a cross sectional view of a semiconductor display device of the present invention.
Figure 7B:
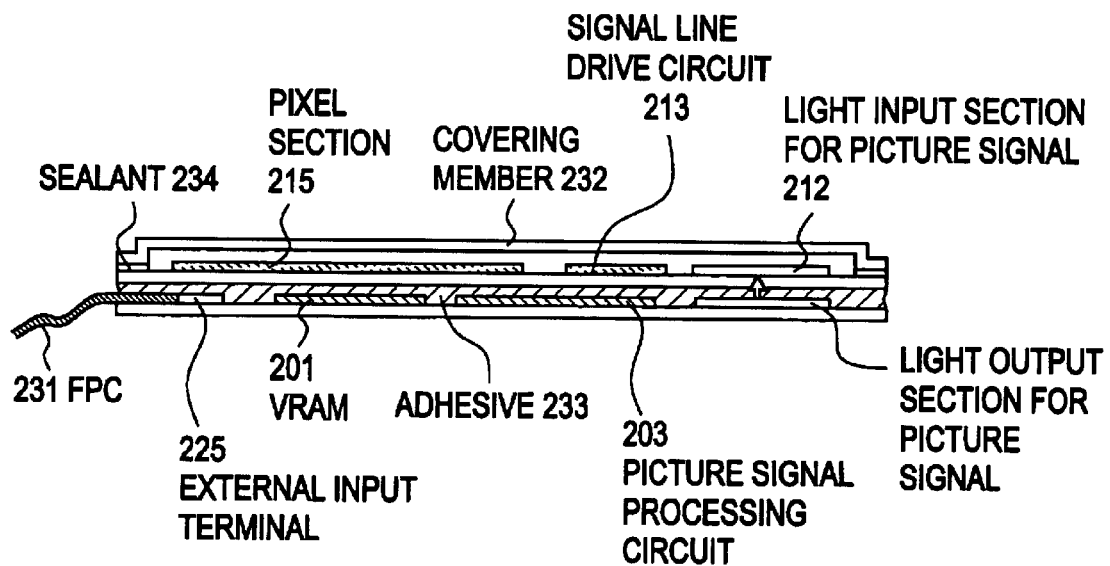

Next, an appearance of a semiconductor display device of the present Example will be described below. FIG. 7A is one Example of a perspective view of a semiconductor display device shown in FIG. 5. Moreover, FIG. 7B shows its cross section.

The external input terminal 225 formed on the first substrate 200 has been connected to a FPC 231, and data having image information is inputted into the external input terminal 225 via the FPC 231. Moreover, as shown in FIG. 7B, a VRAM (Video Random Access Memory) 201, the picture signal processing circuit 203, and the light output section for picture signal 205 have been provided on the first substrate 200. It should be noted that except showing in FIG. 7B, the timing signal generation circuit 202 and the light output section for control signal 204 have been formed on the first substrate 200.

The first substrate 200 is pasted together with the second substrate 210 by an adhesive 233 in such a manner that the first substrate 200 opposes to the second substrate 210. This adhesive 233 may be a material that transmits the light, and further a material having the optimum refractive index from the viewpoint of considering the crosstalk.

The pixel section 215, the signal line drive circuit 213 and the light input section for picture signal 212 have been formed on the second substrate 210. It should be noted that except showing in FIG. 7B, the scan line drive circuit 214 and the light input section for control signal 211 have been formed on the second substrate 210.

The pixel section 215 formed on the second substrate 210 has been sealed with an inert gas, resin or the like between the second substrate 210 and a covering member 232. It should be noted that the second substrate 210 and the covering member 232 have been sealed with a sealant 234.

The light output section for picture signal 205 formed on the first substrate 200 is overlapped with the light input section for picture signal 212 while sandwiching adhesive 233 and the second substrate 210 between the light input section for picture signal 212 and the relevant light output section for picture signal 205. Moreover, although it is not shown, the light output section for control signal 204 and the light input section for control signal 211 have been also overlapped while sandwiching the adhesive 233 and the second substrate 210 between the light output section for control signal 204 and the light input section for control signal 211.

It should be noted that although in the present Example, a semiconductor display device using an OLED has been described, a semiconductor display device is not limited to this, it might be a semiconductor display device using a light emitting element except for OLED as a display element, or might be a liquid crystal display device (LCD), PDP (Plasma Display Panel), DLP (Digital Light Processing) or the other semiconductor display devices.

The present Example is capable of being carried out in combination with Example 1.

Example 3

In the present Example, one Example of how the substrates on which circuits have been formed are superimposed with one another will be described below.

Figure 8A:
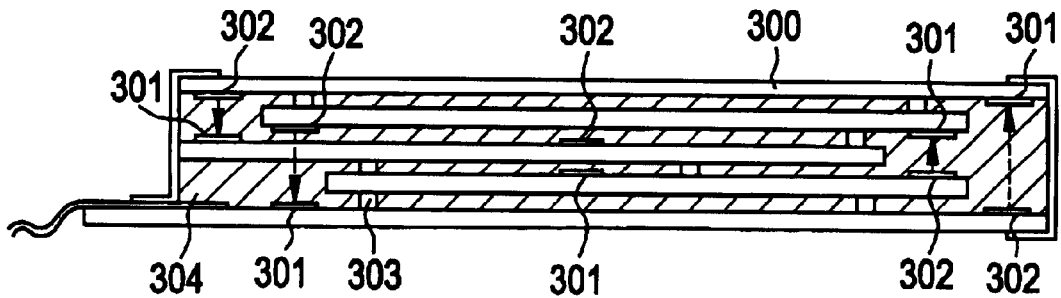
FIG. 8 is a diagram showing one Example concerning with the disposition of a substrate of a semiconductor device of the present invention.

In FIG. 8A, an example of a cross sectional view of a semiconductor device of the present Example is shown. A light input section 301 and a light output section 302 have been provided on a plurality of substrates 300. Moreover, an adhesive 304 has been filled between the respective substrates, and the distance between the substrates has been fixed with a spacer 303.

It should be noted that it is not necessarily required to fill an adhesive between the substrates and it might be available to make the air, an inert gas and the other gas exist between the light input section and the light output section partially using the adhesive.

The light output section 302 provided on each substrate corresponds to at least one light input section 301 formed on the other substrate 300. Then, in the present Example, the position of each substrate 300 in the horizontal direction is determined so that the number of the substrates 300 existing between the corresponding light input sections 301 and the light output sections 302 is as small as possible.

Figure 8B:
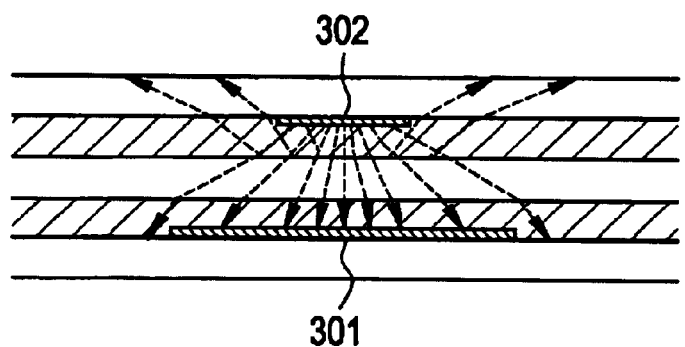
Figure 8C:
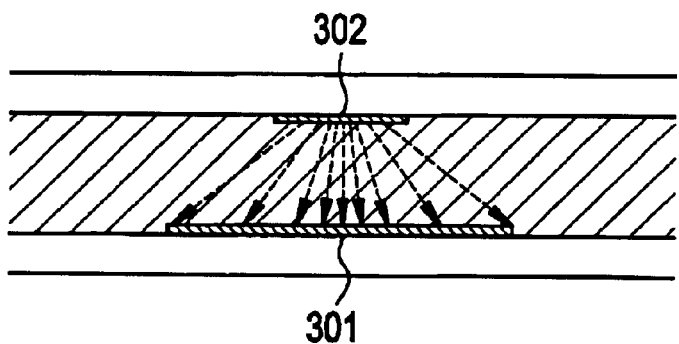

In the case where the number of the substrates 300 existing between the light input sections 301 and the light output sections 302 is large, as shown in FIG. 8B, the light is diffused and crosstalk is easily to occur by the light refracting and one portion of the light being reflected due to the difference of the refraction index between the adhesive 304 and the substrate 300. As shown in FIG. 8C, the diffusion of the light can be suppressed and the crosstalk can be suppressed by reducing the change of the medium in the pathway of the light between the light input section 301 and the light output section 302.

The present Example is capable of being carried out in combination with Example 1 or 2.

Example 4

In the present Example, a configuration in which an optical fiber array that is one of optical waveguides is provided between the light input section and the light output section and the crosstalk is prevented will be described below.

Figure 9A:
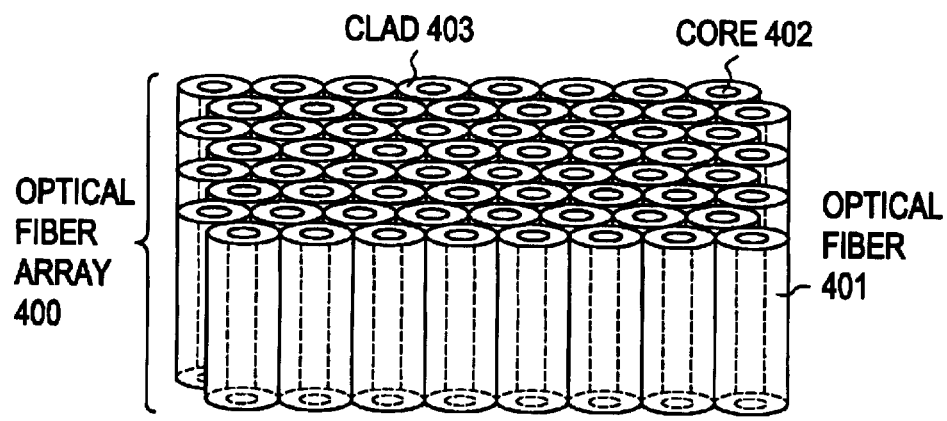
FIG. 9 is a drawing showing the positional relationship between an optical fiber array and a light input and output section.

In FIG. 9A, one portion of an optical fiber array which is enlarged is shown. An optical fiber array 400 is a stack of a plurality of optical fibers 401, and a space between the respective optical fibers 401 has been filled with a buffer member or the like. All of the optical fibers 401 have been arranged so that the propagation directions of the lights become uniform.

The optical fiber 401 is configured with a core 402 in which refraction index of the propagated light is high and a clad 403 which exists around the core and whose refraction index is low.

Figure 9B:
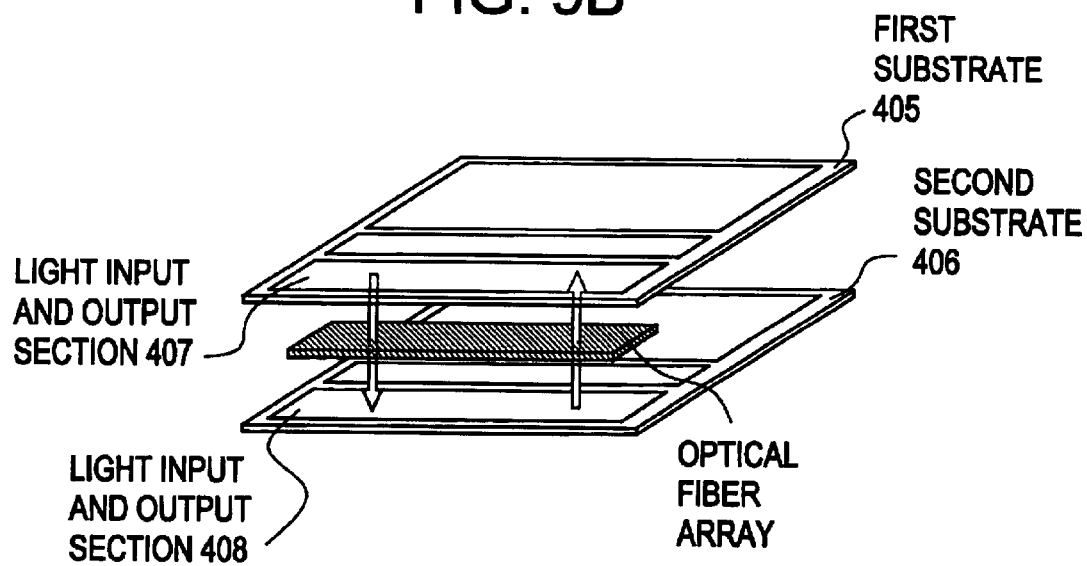

In FIG. 9B, how the optical fiber array 400 is arranged between two substrates is shown. The light input and output sections 407 and 408 have been provided so as to be opposed each other on a first substrate 405 and a second substrate 406, respectively. Then, the optical fiber array 400 has been arranged between the first substrate 405 and the second substrate 406 so as to be sandwiched between the light input and output sections 407 and 408.

The optical fiber array 400 has been arranged so that the propagation direction of the light within the optical fiber array 400 and the progression direction of an optical signal between the light input and output sections 407 and 408 correspond to each other.

As shown in the present Example, by utilizing an optical fiber array, the directivity of the light emitted from a light emitting element is enhanced, and the crosstalk can be effectively prevented.

The present Example is capable of being carried out in combination with Examples 1–3.

Example 5

In the present Example, a concrete method of fabricating a light input section and a light output section on the same substrate will be described below.

In FIG. 10, no alkali glass substrate represented by, for example, 1737 glass substrate made by Corning, Co., Ltd. has been used for a substrate 500. Then, an under coating film 501 has been formed on the surface on which an element of the substrate 500 has been formed by a plasma CVD method or a sputtering method. Although the under coating film 501 is not shown, a silicon nitride film having a thickness of 25–100 nm (here, it has been made in a thickness of 50 nm) and a silicon oxide film having a thickness of 50–300 nm (here, it has been made in a thickness of 150 nm) have been formed. Moreover, only silicon nitride film and silicon nitride oxide film may be used for the under coating film 501.

Next, an amorphous silicon film having a thickness of 50 nm has been formed on this under coating film 501 by a plasma CVD method. It is desirable that although depending upon its hydrogen content, the amorphous silicon film is heated preferably at 400–550° C. for several hours, dehydrogenation treatment is performed, the hydrogen content is made 5 or less atomic %, and the step of crystallization is performed. Moreover, the amorphous silicon film may be formed by the other methods such as a sputtering method, a vapor deposition method or the like, however, it is desirable that impurity elements such as oxygen, nitrogen and the like contained in the film have been previously and sufficiently reduced.

It should be noted that it might be also available that not only silicon but also silicon germanium is used for semiconductor film. In the case where silicon germanium is used, it is preferable that the density of germanium is in the order of 0.01–4.5 atomic %.

Now, both of the under coating film and amorphous silicon film are fabricated by a plasma CVD method, and at this time, the under coating film and amorphous silicon film may be formed in vacuum in series. The pollution of the surface is capable of being prevented by firstly performing the step of not exposing to the ambient air atmosphere after the under coating film 501 has been formed, and the variation of the characteristics of the fabricated TFT could be reduced.

Then, an amorphous silicon film is crystallized by a known technology, a crystal silicon film (referred to as polycrystalline silicon film or polysilicon film) is formed. As a known method of crystallization, there are a thermocrystallization method using an electrically heated oven, a laser annealing crystallization method using a laser beam, and a lamp annealing crystallization method using an infrared ray. In the present Example, the crystallization is performed by utilizing an excimer laser beam using XeCl gas.

It should be noted that a pulse oscillation type excimer laser beam which has been worked into a linear shape is used in the present Example, however, it may be a rectangular shaped pulse, or a continuous oscillation type argon laser beam and a continuous oscillation type excimer laser beam can be also used.

Moreover, although in the present Example, a crystal silicon film is used as an active layer of TFT, an amorphous silicon film is also capable of being used as an active layer.

It should be noted that it is effective that an active layer of TFT requiring the reduction of OFF-state current is formed with an amorphous silicon film, an active layer of TFT which attaches importance to the largeness of ON-state current is formed with a crystal silicon film. Since the carrier mobility of an amorphous silicon film is low, it is not easy to allow current to flow and also it is not easy to allow OFF-state current to flow. Specifically, the advantages of both of an amorphous silicon film which is not easy to allow current to flow and a crystal silicon film which is easy to allow current to flow can be exploited.

The patterning of the crystal silicon film thus formed was performed, a semiconductor layer in an insular shape (hereinafter, referred to as an active layer) 503–505 were formed.

Next, a gate insulating film 506 whose major component is silicon oxide or silicon nitride was formed by covering active layers 503–505. In the present Example, TEOS (Tetraethyl Orthosilicate) and $O_2$ were mixed by a plasma CVD method, and a silicon oxide film was formed by discharging under the conditions of the reaction pressure 40 Pa, the substrate temperature 300–400° C., the high frequency (13.56 MHz), the power density in the range of 0.5–0.8 W/cm$^2$. Then, the silicon oxide film thus prepared can obtain an excellent characteristics as a gate insulating film by thermo-annealing at 400–500° C. Moreover, aluminum nitride can be used as a gate insulating film. Aluminum nitride is comparatively high at thermal conductivity, the heat generated at a TFT can be effectively diffused. Moreover, after silicon oxide and silicon oxide nitride and the like not containing aluminum have been formed, a layer in which layers of aluminum nitride are laminated may be used as a gate insulating film (FIG. 10A).

Then, an electrically conductive film having a thickness in the range from 100 to 500 nm is formed on the gate insulating film 506, and gate electrodes 508–510 are formed by performing the patterning these.

It should be noted that in the present Example, a gate electrode is formed with elements selected from Ta, W, Ti, Mo, Al (Aluminum) and Cu or with an alloy material or a compound material whose major components are the foregoing elements. Moreover, a semiconductor film represented by a polycrystalline silicon film into which impurity elements such as phosphorus and the like have been doped may be also used. Moreover, it may be also a laminated layer consisted of a plurality of layers, which is not an electrically conductive film consisted of a single layer.

For example, it is preferable that the laminated layer is formed according to the combination of a first electrically conductive film being formed with tantalum nitride (TaN) and a second electrically conductive film being formed with W, the combination of the first electrically conductive film being formed with tantalum nitride (TaN) and the second electrically conductive film being formed with Al, and the combination of the first electrically conductive film being formed with tantalum nitride (TaN) and the second electrically conductive film being formed with Cu (copper). Moreover, a semiconductor film represented by a polycrystalline silicon film in which impurity elements such as phosphorus and the like have been doped as the first electrically conductive film and the second electrically conductive film and Ag—Pd—Cu alloy may be also used.

Moreover, it is not limited to two-layers structure, for example, it may be a three-layers structure in which a tungsten film, an alloy (Al—Si) film consisted of aluminum and silicon, a titanium nitride film have been in turn laminated. Moreover, in the case where it is made as a three-layers structure, tungsten nitride instead of tungsten may be used, an alloy film of aluminum and titanium (Al—Ti) instead of an alloy (Al—Si) film of aluminum and silicon may be used, and a titanium film instead of a titanium nitride film may be used.

It should be noted that it is important that the most suitable method of etching and kind of an etchant are selected according to those materials of electrically conductive films.

Next, the step in which n-type impurity element is added is performed, and n-type impurity regions 512–517 are formed. Here, it was performed by an ion doping method using phosphine (PH$_3$).

Next, the region where n-channel type TFT has been formed is covered with a resist mask 520, the step in which a p-type impurity element is added was performed to a region where a p channel type TFT is formed and p-type impurity regions 521 and 522 have been formed. Here, diborane (B$_2$H$_6$) was used, and it was added by an ion doping method (FIG. 10C).

Then, for the purpose of controlling an electrically conductive type, the step in which an impurity element added to the respective semiconductor layers in an insular shape is activated is performed. This step is performed by a thermal annealing method using a furnace annealing oven. Except for this, a laser annealing method or rapid thermal annealing method (RTA method) can be applied. As for the thermal annealing method, it is performed under the conditions of oxygen concentration being 1 ppm or less, preferably, in the nitrogen atmosphere of 0.1 ppm or less, at 400–700° C., representatively, at 500–600° C., but in the present Example, a thermal treatment is performed at 500° C. for 4 hours. However, in the case where the gate electrodes 508–510 are weak at heating, after an interlayer dielectric film (whose major component is silicon) has been formed for the purpose of protecting the wirings or the like, it is preferable that the activation is performed.

Furthermore, the thermal treatment is performed at 300–450° C. for 1–12 hours in the atmosphere containing hydrogen of 3–100%, and the step in which a semiconductor layer in an insular shape is hydrogenated. This step is a step in which the dangling bond of the semiconductor layer is terminated with a hydrogen thermally excited. As the other means of hydrogenation, a plasma hydrogenation (using a hydrogen excited by plasma) may be performed.

Next, as shown in FIG. 10D, a first inorganic insulating film 521 consisted of silicon oxide nitride having a thickness in the range from 10 to 200 nm is formed by utilizing a CVD method. It should be noted that as for the first inorganic insulating film is not limited to the silicon oxide nitride film and it may be an inorganic insulating film containing nitrogen, with which going in and out of water into an organic resin film formed later can be suppressed, for example, silicon nitride, aluminum nitride or aluminum oxide nitride can be used.

It should be noted that the thermal conductivity of aluminum nitride is comparatively high, and the heat occurred in a TFT, a light emitting element and the like could be effectively diffused.

Next, an organic resin film 522 consisted of a positive type photosensitive organic resin is formed on the first inorganic insulating film 521. Although in the present Example, the organic resin film 522 is formed using a positive type photosensitive acrylic, the present invention is not limited to this.

In the present Example, the organic resin film 522 is formed by coating the positive type photosensitive acrylic by a spin coat method and sintering it. It should be noted that the film thickness of the organic resin film 522 is made so as to be in the order of 0.7–5 μm (further preferably, in the range from 2 to 4 μm) after the sintering it.

Next, the portion where the opening is contemplated to form is exposed to the light using a photomask. Then, after it has been developed with a developer whose major component is TMAH (Tetramethyl Ammonium Hydroxide), the substrate is dried and the sintering is performed at 220° C. for about one hour. Then, as described in FIG. 10D, the opening is formed on the organic resin film 522, and it becomes a state where one portion of the first inorganic insulating film 521 is exposed on the relevant opening.

It should be noted that since a positive type photosensitive acrylic is colored in a light brown, when the light emitted from the light emitting element goes toward the substrate side, the decoloring treatment is provided. In this case, prior to the sintering, the whole of the photosensitive acrylic after the development is again exposed to the light. The exposure to the light at this time is made to completely perform the exposure by irradiating a rather intense light and making the irradiating time longer comparing to the exposure for forming the opening. For example, when a positive type acrylic resin having a film thickness of 2 μm is decolored, in the case where a magnification projection aligner (concretely, MPA made by Canon, Co., Ltd.) utilizing the multiwavelength light consisted of g line (436 nm), h line (405 nm) and i line (365 nm), which are spectral beams of super high pressure mercury vapor lamp is used, the radiation is performed for about 60 seconds. The positive type acrylic resin is completely decolored by exposing it to the beam.

Moreover, in the present Example, after the development, the sintering is performed at 220° C., however, it may be sintered at a high temperature of 220° C. after the sintering is performed at a low temperature of about 100° C. as a prebake following the development.

Then, the second inorganic insulating film 523 consisted of silicon nitride covering the relevant opening to which one portion of the first inorganic insulating film 521 has been exposed and the organic resin film 522, is formed into a film by utilizing a RF sputtering method. It is preferable that the film thickness of the second inorganic insulating film 523 is in the range from about 10 to about 200 nm. Moreover, the second inorganic insulating film is not limited to silicon oxide nitride film, an inorganic insulating film containing nitrogen capable of suppressing the going in and out of water to the organic resin film 522 maybe available, for example, silicon nitride, aluminum nitride or aluminum oxide nitride can be used.

It should be noted that as for a silicon oxide nitride film or an aluminum oxide nitride film, the ratio of atomic % of its oxygen and nitrogen is involved in their barrier character. The higher the rate of nitrogen to oxygen is, the more the barrier character is enhanced. Moreover, concretely, it is preferable that the ratio of nitrogen is higher than the ratio of oxygen.

Moreover, the film formed using a RF sputtering method is high at denseness and excellent at barrier character. As for the conditions of the RF sputtering, for example, in the case where a silicon oxide nitride film is formed into a film, N$_2$, Ar, and N$_2$O are allowed to flow using Si target so that the flow ratio of gases becomes 31:5:4, and the film is formed under the conditions of the pressure 0.4 Pa and the power 3000 W. Moreover, for example, in the case where a silicon nitride film is formed, N$_2$ and Ar within the chamber are allowed to flow so that the flow ratio of the gasses becomes 20:20, and the film is formed under the conditions of the pressure 0.8 Pa, the power 3000 W, the film formation temperature of 215° C.

The first interlayer dielectric film is formed with this organic resin film 522, the first inorganic insulating film 521 and the second inorganic insulating film 523.

Next, as shown in FIG. 11A, a resist mask 524 is formed at the opening of the organic resin film 522, and a contact hole is formed on the gate insulating film 506, the first inorganic insulating film 521 and the second inorganic insulating film 523 by utilizing a dry etching method.

The impurity regions 512–515, 516 and 517 are in a state being partially exposed by opening this contact hole. The conditions of this dry etching are appropriately set according to the materials of the first inorganic insulating film 521 and the second inorganic insulating film 523. Since in the present Example, silicon oxide is used for the gate insulating film 506, silicon oxide nitride is used for the first inorganic insulating film 521 and silicon nitride is used for the second inorganic insulating film 523, first, the second inorganic insulating film 523 consisted of silicon nitride and the first inorganic insulating film 521 consisted of silicon oxide nitride are etched by making $CF_4$, $O_2$, and He as an etching gas, and then, the gate insulating film 506 consisted of silicon oxide is etched using $CHF_3$.

It should be noted that upon etching, it is essential to make it so that the organic resin film 522 is not exposed at the opening.

Next, an electrically conductive film is formed into a film on the second inorganic insulating film 523 so as to cover the contact hole, and the wirings 526–531 connected to the first impurity regions 512–515, 516 and 517 are formed by performing the patterning of these.

It should be noted that in present Example, an electrical conductive film having a three-layers structure in which a Ti film having a thickness of 100 nm, Al film having a thickness of 300 nm and a Ti film having a thickness of 150 nm have been formed in series on the second inorganic insulating film 523 by a sputtering method, but the present invention is not limited to this configuration. It may be formed with an electrically conductive film having a single layer, or it may be formed with an electrically conductive film consisted of a plurality of layers except for three-layers one. Moreover, as for material, the present invention is not limited to this, too.

For example, after the Ti film has been formed into a film, an electrically conductive film in which an Al film containing Ti is laminated may be used, or an electrically conductive film in which an Al film containing W may be used after the formation of the Ti film.

Next, an organic resin film 533 which is to be a bank is formed on the second inorganic insulating film 523. Although in the present Example, a positive type photosensitive acrylic is used, the present invention is not limited to this. In the present Example, an organic resin film is formed by coating a positive type photosensitive acrylic by a spin coat method, and by sintering it. It should be noted that the film thickness of the organic resin film 533 is made so that it becomes in the range of about 0.7 to about 5 μm (more preferably, in the range from 2 to 4 μm) after performing the sintering of it.

Next, the portion where the opening is contemplated to form is exposed to the light using a photomask. Then, after it has been developed with a developer whose major component is TMAH (Tetramethyl Ammonium Hydroxide), the substrate is dried and the sintering is performed at 220° C. for about one hour. Then, as described in FIG. 1C, a bank 533 having the opening is formed, and the wirings 529 and 531 become a state where one portions of these are exposed at the relevant opening.

It should be noted that since a positive type photosensitive acrylic is colored in a light brown, when the light emitted from the light emitting element goes toward the substrate side, the decoloring treatment is provided. The decoloring treatment is performed similar to the decoloring treatment provided to the organic resin film 522.

Since the cross section of the opening can be rounded by utilizing an organic resin having a photosensitivity for the bank, the coverage of the electroluminescent layer and a cathode which are formed later can be made excellent, and failures what is called a shrink that the light emitting region is reduced can be reduced.

Then, as shown in FIG. 12A, the third inorganic insulating film 534 consisted of silicon nitride covering the relevant openings to which portions of the wirings 529 and 531 have been exposed and the bank 533 is formed into a film using a RF sputtering method. It is desirable that the film thickness of the third inorganic insulating film 534 is in the range from about 10 to about 200 nm. Moreover, the third inorganic insulating film is not limited to silicon oxide nitride film, an inorganic insulating film containing nitrogen capable of suppressing the going in and out of water to the bank 533 may be available, for example, silicon nitride, aluminum nitride or aluminum oxide nitride can be used.

It should be noted that as for a silicon oxide nitride film or an aluminum oxide nitride film, the ratio of atomic % of its oxygen and nitrogen is largely involved in the barrier character. The higher the rate of nitrogen to oxygen is, the more the barrier character is enhanced. Moreover, concretely, it is desirable that the ratio of nitrogen is higher than the ratio of oxygen.

Next, as shown in FIG. 12A, a resist mask 535 is formed at the opening of the bank 533, and a contact hole is formed on the third inorganic insulating film 534 using a dry etching method.

The wirings 529 and 531 are in a state being partially exposed by opening of this contact hole. The conditions of this dry etching are appropriately set according to the materials of the third inorganic insulating film. Since in the present Example, silicon nitride is used for the third inorganic insulating film 534, the third inorganic insulating film 534 consisted of silicon nitride is etched by making $CF_4$, $O_2$, and He as an etching gas.

It should be noted that upon etching, it is essential to make it so that the bank 533 is not exposed at the opening.

Next, a transparent electrically conductive film, for example, an ITO film is formed in a thickness of 110 nm and the patterning of it is performed, thereby forming a pixel electrode 540 in contact with the wiring 531 and a drawer wiring 541 for obtaining the current generated at diode. Moreover, a transparent electrically conductive film in which zinc oxide in the range from 2 to 20% has been mixed with indium oxide may be used. This pixel electrode 540 becomes an anode of a light emitting element (FIG. 12B).

Next, the electroluminescent layer 542 is formed on the pixel electrode 540 by a vapor deposition method, and further, a cathode (Mg—Ag electrode) 543 is formed by a vapor deposition method. At this time, it is desirable that the heating treatment to the pixel electrode 540 has been performed prior to the formation of the electroluminescent layer 542 and the cathode 543 and water has been completely removed. It should be noted that although in the present Example, a Mg—Ag electrode is used as a cathode of an OLED, the other known materials, for example, Ca, Al, Ca—F, Mg—Ag and Al—Li might be available if it is an electrically conductive film having a small work function.

It should be noted that Al—Li was used as a cathode, it could prevent Li existed in Al—Li from entering into the side of the substrate from the third interlayer dielectric 534 by the third interlayer dielectric 534 containing nitrogen.

It should be noted that as an electroluminescent layer 542, known materials are capable of being used. In the present Example, a two-layers structure consisted of a hole transporting layer and an emitting layer is made as an electroluminescent layer, however, any one of a hole transporting layer, an electron injection layer or an electron transportation layer may be provided. In this way, as for the combinations, a variety of examples have been already reported, and any one of those configurations may be used. For example, SAlq, CAlq and the like maybe used as an electron transportation layer or a hole blocking layer.

It should be noted that the film thickness of the electroluminescent layer 542 might be made so as to be in the range from 10 to 400 nm (typically in the range from 60 to 150 nm) and the thickness of the cathode 543 might be made so as to be in the range from 80 to 200 nm (typically in the range from 100 to 150 nm).

In this way, a light emitting device having a structure as shown in FIG. 12B is completed. In FIG. 12B, the reference numeral 550 denotes a light output section, the reference numeral 551 denotes a light input section. In the light output section 550, the portion 552 where the pixel electrode 540, the electroluminescent layer 542, and the cathode 543 are superimposed with one another corresponds to a light emitting element.

The reference numeral 553 denotes a TFT used for a photo-detecting element, and such a voltage that current is not allowed to flow into a channel formation region 555 provided between the impurity region 515 and the impurity region 514 when the light is not irradiated into the photo-detecting element 553 is given to the gate electrode 509. Specifically, in the case where the TFT 553 is a n-channel type TFT, a voltage lower than the threshold voltage is given, and in the case where the TFT 553 is a p-channel type TFT, a voltage higher than the threshold voltage is given.

It should be noted that the configurations and concrete methods of fabrication of TFTs shown in the present Example are only examples and the present invention is not limited to those configurations.

Moreover, the structure of a TFT that a semiconductor device of the present invention has is not limited to those shown in the present Example. The configuration of a TFT is capable of being appropriately set by the designer.

It should be noted that actually, when it has been completed to the stage shown in FIG. 12B, it is preferable that it is packaged with a protective film (laminated film, ultraviolet ray hardening resin film or the like) whose air tight sealing character is high and whose amount of degassing is little or it is packaged with a transparent covering material so as not to be exposed to the outside air. At that time, the reliability of the light emitting element is enhanced if the inside of the covering material is filled with an inert atmosphere and a moisture absorption material (e.g., barium oxide) is disposed inside.

It should be noted that the present invention is not limited to the methods of fabrication described above and it is capable of being fabricated using known methods. Moreover, the present Example is capable of being freely combined with Example 1-Example 4.

Example 6

In the present Example, the configuration different from the light input sections and the light output sections on the same substrate which is shown in FIG. 5 will be described below.

In FIG. 13A, a cathode electrode 560 is formed on the second inorganic insulating film 565. The cathode electrode 560 is obtained by adding the impurities that give the electrically conductive type to the semiconductor film. Then, a photoelectric conversion layer 561 and an anode electrode 562 are in turn laminated on the cathode electrode 560. Similar to the cathode electrode 560, the anode electrode 562 is also obtained by adding impurities that give the one electrically conductive type, which is contrary to type of the cathode electrode 560, to a semiconductor film. A photodiode 563 is formed with the cathode electrode 560, the photoelectric conversion layer 561 and the anode electrode 562.

On the other hand, an opening is formed at the bank 566 formed with a photosensitive organic resin, and the anode electrode 562 and the wiring 568 connected to a TFT 567 are partially exposed at the relevant openings. Then, the third inorganic insulating film 569 is formed on the bank 566 so as to cover the opening.

Then, the third inorganic insulating film 569 is dry-etched at the opening of the bank 566, and the anode electrode 562 and the wiring 568 connected to the TFT 567 are partially exposed. Then, the drawer wiring 564 for obtaining current generated in the photo-diode 563 is formed on the third inorganic insulating film 569, which is a third interlayer dielectric film, so as to be connected to the anode electrode 562.

Moreover, a pixel electrode 571 of a light emitting element 570 is formed on the third inorganic insulating film 569. Then, an electroluminescent layer 572 and a cathode electrode 573 are in turn laminated on the pixel electrode 571. The light emitting element 570 is configured with the pixel electrode 571, the electroluminescent layer 572 and the cathode electrode 573.

In FIG. 13A, the drawer wiring 564 and the pixel electrode 571 are formed with a transparent electrically conductive film. Hence, the light emitted from the light emitting element 570 is irradiated to the side of the substrate.

In FIG. 13B, the configuration in which the cathode is used for the pixel electrode of the light emitting element and the light emitted from the light emitting element is irradiated to the opposite side of the substrate is shown. In FIG. 13B, a drawer wiring 580 and a pixel electrode 581 are formed with the same cathode material, an anode 583 is formed so as to superimpose while sandwiching an electroluminescent layer 582 on the pixel electrode 581 between the pixel electrode 581 and the anode 583. A light emitting element 584 is formed with the pixel electrode 581, the electroluminescent layer 582 and the anode 583.

The present Example is capable of being carried out in combination with Examples 1–5.

Example 7

A semiconductor device of the present invention is capable of being applied to a variety of electronic equipments. As examples of these, a portable information terminal (electronic note, mobile computer, portable telephone or the like), a video camera, a digital camera, a personal computer, a television receiver, a portable telephone, a projection type display device and the like are listed. Concrete examples of those electronic equipments are shown in FIG. 14.

Figure 14A:
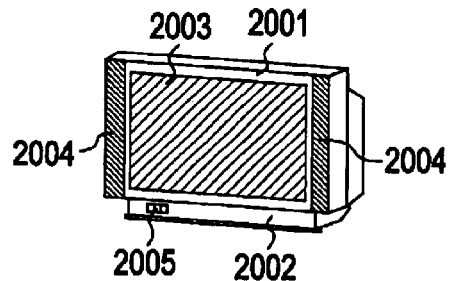
FIG. 14 is a diagram showing the steps of fabricating a semiconductor device of the present invention.

FIG. 14A shows a display device, in which a frame 2001, a supporting base 2002, a display section 2003, a speaker section 2004, a video input terminal 2005 and the like are included. A display device of the present invention is completed by utilizing a semiconductor device of the present invention for the display section 2003 or the other circuits. It should be noted that the display device includes all of display devices for information display used for a personal computer, used for receiving a TV broadcast, used for advertisement display and the like.

Figure 14B:
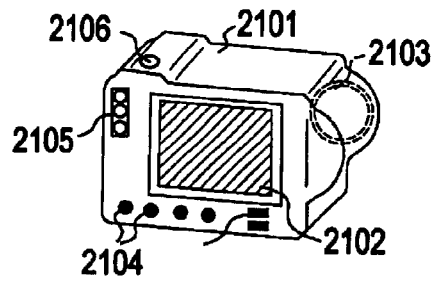

FIG. 14B shows a digital still camera, which includes a body 2101, a display section 2102, a receiver section 2103, an operation key 2104, an external connecting port 2105, a shutter 2106 and the like. A digital still camera of the present invention is completed by utilizing a semiconductor device of the present invention for the display section 2102 or the other circuits.

Figure 14C:
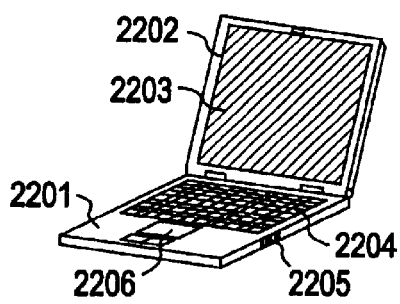

FIG. 14C shows a notebook-sized personal computer, which includes a body 2201, a frame 2202, a display section 2203, a key board 2204, an external connecting port 2205, a pointing mouse 2206 and the like. A notebook-sized personal computer of the present invention is completed by utilizing a semiconductor device of the present invention for the display section 2203 or the other circuits.

Figure 14D:
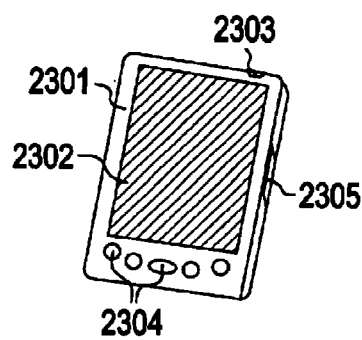

FIG. 14D shows a mobile computer, which includes a body 2301, a display section 2302, a switch 2303, an operation key 2304, an infrared ray port 2305 and the like. A mobile computer of the present invention is completed by utilizing a semiconductor device of the present invention for the display section 2302 or the other circuits.

Figure 14E:
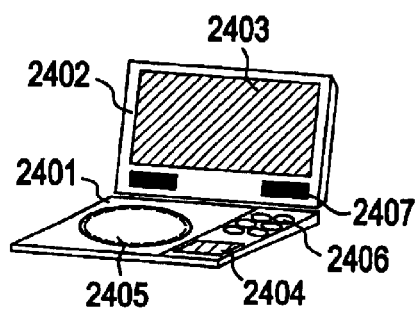

FIG. 14E shows a portable image restoration device equipped with a recording medium (concretely, DVD restoration device), which includes a body 2401, a frame 2402, a display section A2403, a display section B2404, a recording medium (DVD and the like) reading section 2405, an operation key 2406, a speaker section 2407 and the like. The display section A2403 mainly displays image information, and the display section B2404 mainly displays character information. It should be noted that an image restoration device equipped with a recording medium includes a game machine for household. An image restoration device is completed by utilizing a semiconductor device of the present invention for the display sections A, B2403, 2404 or the other circuits.

Figure 14F:
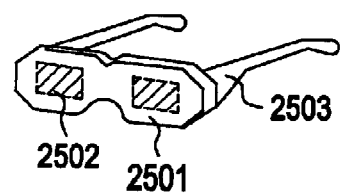

FIG. 14F shows a goggle type display (head mount display), which includes a body 2501, a display section 2502, and an arm section 2503. A goggle type display of the present invention is completed by utilizing a semiconductor device of the present invention for the display section 2502 or the other circuits.

Figure 14G:
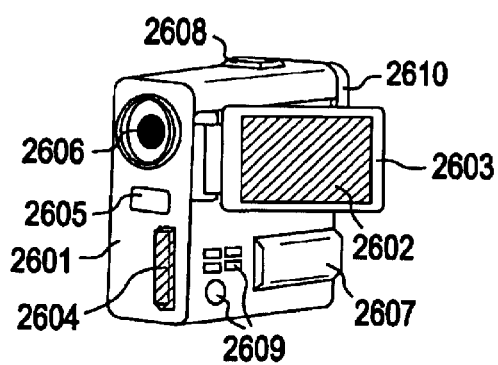

FIG. 14G shows a video camera, which includes a main body 2601, a display section 2602, a frame 2603, an external connecting port 2604, a remote control receiving section 2605, a receiver section 2606, a battery 2607, a voice input section 2608, an operation key 2609, an ocular section 2610 and the like. A video camera of the present invention is completed by utilizing a semiconductor device of the present invention for the display section 2602 or the other circuits.

Figure 14H:
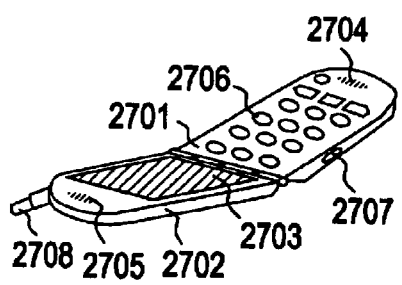

Now, FIG. 14H shows a portable telephone, which includes a body 2701, a frame 2702, a display section 2703, a voice input section 2704, a voice output section 2705, an operation key 2706, an external connection port 2707, an antenna 2708 and the like. It should be noted that the consuming current of the portable telephone could be suppressed by displaying white characters upon the black background on the display section 2703. A portable telephone of the present invention is completed by utilizing a semiconductor device of the present invention for the display section 2703 or the other circuits.

As described above, the application scope of the present invention is extremely wide, and is capable of being utilized for electronic equipments of all fields. Moreover, the present Example is capable of being carried out in combination on with any one of configurations shown in Examples 1–6.

Example 8

It is desirable from the viewpoint of reduction of crosstalks that a light emitted from a light emitting element is a light having a high directivity. In the present Example, the configuration of a light emitting element which can obtain a light having a high directivity will be described below.

Figure 15A:
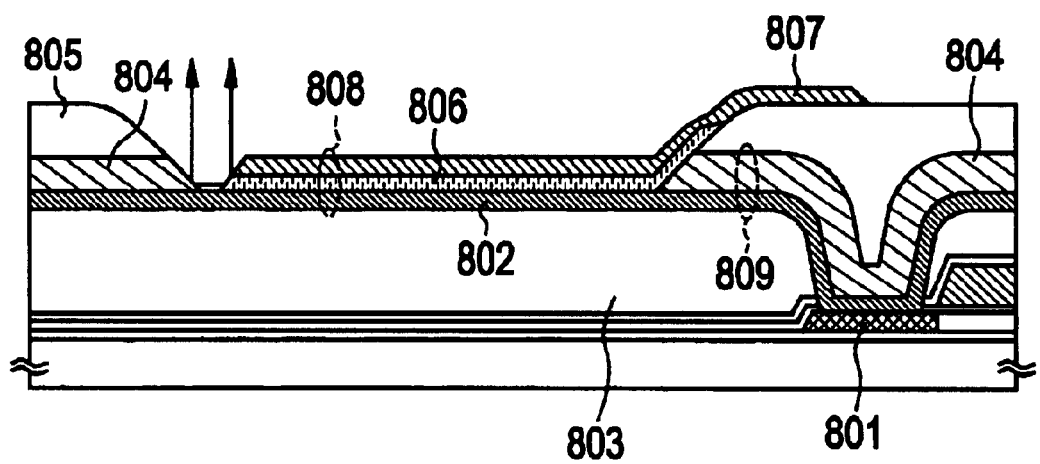
FIG. 15 is a diagram showing one Example of a light emitting element of a semiconductor device of the present invention.

In FIG. 15A, a cross section of a light emitting element which can obtain a light having a high directivity is shown. In FIG. 15A, an interlayer dielectric film 803 is formed so as to cover TFT The relevant interlayer dielectric film 803 has an opening, and an impurity region 801 of TFT is in contact with the wiring 809 formed on the interlayer dielectric film 803 at the relevant opening.

The wiring 809 is formed by laminating a plurality of electrically conductive films, and in the present Example, a first electrically conductive film 802 consisted of TaN, a second electrically conductive film 804 consisted of Al are in turn laminated. Although the first electrically conductive film 802 and the second electrically conductive film 804 are not limited to these materials, since as for the first electrically conductive film 802, one portion of it is used as a cathode of a light emitting element, a material having a low work function sufficient for using as a cathode, and further, a material which does not transmit the light and by which the light is reflected is used.

Then, an organic resin film is formed by covering the wiring 809 and partially etched, thereby forming a bank 805 having an opening. At this time, the second electrically conductive film 804 of the wiring 809 is also partially etched as well as the organic resin film is etched, and the first electrically conductive film 802 which is to be a cathode is partially exposed.

Then, an electroluminescent layer 806 is formed into a film at the opening of the bank 805. In the present Example, the electroluminescent layer 806 is formed so that the second electrically conductive film 804 is partially exposed at the end portion of the opening of the bank 805, however, it may be completely covered with the electroluminescent layer 806 so that the electrically conductive film 804 is not exposed.

Then, an anode 807 is formed into a film on the electroluminescent layer 806. It is preferable that as for the anode 807, a material whose work function is sufficiently high for using as an anode and a material which does not transmit the light and by which the light is reflected is used in order to enclose the light within the electroluminescent layer 806 to some extent. In the present Example, AlLi was used as an anode 807.

A light emitting element 808 is formed at the portion where the first electrically conductive film 802, the electroluminescent layer 806 and the anode 807 are superimposed with one another.

Furthermore, as for the anode 807, the electroluminescent layer 806 is formed whereas one portion of the electroluminescent layer 806 is exposed so that the light is reflected on the second electrically conductive film 804 and irradiated at the end portion of the opening of the bank 805. By means of the above-described configuration, since the light generated on the electroluminescent layer 806 is repeatedly reflected on the first electrically conductive film 802 and the anode 807, and irradiated from the portion where one portion of the electroluminescent layer 806 is exposed at the end portion of the opening of the bank 805, and further, is reflected by the second electrically conductive film 804 at the end portion of the opening of the bank, the light having an excellent directivity is obtained.

It should be noted that for the purpose of preventing the deterioration of the electroluminescent layer 806, it might be available so that the portion where the light is irradiated is not completely exposed, but it is covered with a metal film which is sufficiently thin to transmit the light or the other films having a transparency, thereby preventing water and oxygen from mixing within the electroluminescent layer 806.

Figure 15B:
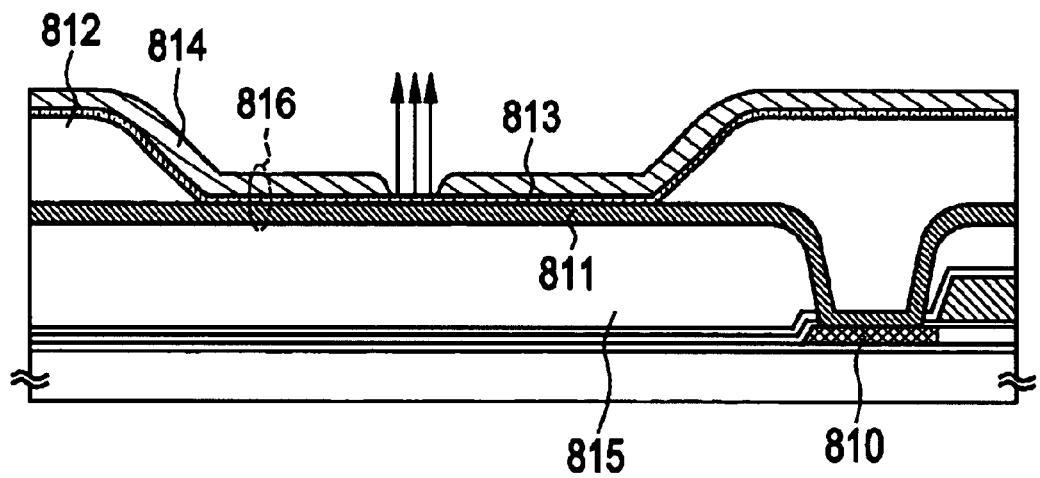

In FIG. 15B, a cross sectional view which is different from that of FIG. 15A of a light emitting element with which the light having a high directivity is obtained is shown.

In FIG. 15B, an interlayer dielectric film 815 is formed so as to cover a TFT. The relevant interlayer dielectric film 815 has an opening, and an impurity region 810 of the TFT is in contact with a wiring 811 formed on the interlayer dielectric film 815 at the relevant opening.

Since one portion of the wiring 811 is used as a cathode of a light emitting element, a material having a work function sufficiently low for using as a cathode and a material which does not transmit the light and by which the light is reflected is used. In the present Example, TaN was used.

Then, an organic resin film covering a wiring 811 is formed and partially etched, thereby forming a bank 812 having an opening. Then, an electroluminescent layer 813 is formed at the opening of the bank 812. Then, an anode 814 is formed on the electroluminescent layer 813. It is desirable that as for the anode 814, for the purpose of enclosing the light within the electroluminescent layer 813 to some extent, a material having a work function sufficiently high for using it as an anode, and further, a material which does not transmit the light and by which the light is reflected is used. In the present Example, AlLi was used as the anode 814.

A light emitting element 816 is formed on the portion where the wiring 811, the electroluminescent layer 813 and the anode 814 are superimposed with one another.

Furthermore, the anode 814 is formed so that the anode 814 has an opening on the region where the electroluminescent layer 813 and the wiring 811 are superimposed with each other at the opening of the bank 812 and one portion of the electroluminescent layer 813 is exposed at the relevant opening. By means of the above-described configuration, since the light generated on the electroluminescent layer 813 repeatedly reflected on the wiring 811 and the anode 814 and is irradiated from the portion where one portion of the electroluminescent layer 813, the light having an excellent directivity is obtained.

It should be noted that for the purpose of preventing the deterioration of the electroluminescent layer 813, it might be available so that the portion where the light is irradiated is not completely covered, but it is covered with a metal film which is sufficiently thin to transmit the light or the other films having a transparency, thereby preventing water and oxygen from mixing within the electroluminescent layer 813.

Moreover, in the present Example, the light generated on the electroluminescent layer is irradiated from the opening formed on the anode, however, the light may be irradiated from the opening formed at the anode.

The present Example is capable of being carried out in combination with Examples 1–7.

The present invention is capable of comparatively easily carrying out the transmission of signals between three sheets of substrates or more by utilizing a substrate having a transparency. Moreover, since the bus width of signals for being transmitted between the substrates can be largely taken and parallel operation in circuits on a plurality of glass substrates excellent at efficiency is capable of being carried out, the lowering of the operation rate of the TFT formed on the glass substrate when comparing to a single crystal transistor is capable of being made up.

Moreover, since a plurality of glass substrates can be laminated by utilizing an optical signal for transmitting a signal between substrates even if the degree of integration of circuits formed on glass substrate is low when comparing to a single crystal silicon wafer, it can prevent the device from being bulky in the horizontal direction. Furthermore, it can prevent the wiring from being lengthened, and the increase of the amount of consuming electric power due to the wiring capacitance can be suppressed.

Moreover, since the configuration of TFT of each circuit can be easily optimized if the process is changed per each one substrate, upon the optimization, the increase of the number of the steps per each one sheet of the substrate is suppressed, and the time required for completing the product can be suppressed. Moreover, the cost can be suppressed by utilizing a cheap glass substrate, and the present invention is capable of being fabricated by a simple method.

Then, since one integrated circuit is configured by combining circuits formed on the respective substrates, the yield can be enhanced comparing to the case where an integrated circuit is formed on one substrate. Moreover, the number of terminals such as FPC or the like for electrically connecting between the circuits can be suppressed utilizing an optical signal for transmission of a signal between the substrates, and the reliability of the mechanical strength can be enhanced. Furthermore, even if the amount of information of signals to be processed is increased, the lowering of the yield due to the occurrence of contact failures at the portion of the terminals can be suppressed.

Then, since a light emitting element and a photo-detecting element for performing the sending and receiving of an optical signal, which are different from the terminal of FPC, are not necessarily required to dispose at the end portion of the substrate, the restriction on the layout becomes smaller, and these easily correspond to further increase of information to be processed.

In this way, the present invention is capable of providing a semiconductor device having a high performance and an integrated circuit capable of operating at a high rate.

What is claimed is:

1. A semiconductor device comprising:
   a first substrate;
   a second substrate;
   a first circuit comprising a first semiconductor element and provided over said first substrate;
   a second circuit comprising a second semiconductor element and provided over said second substrate;
   at least one light emitting element provided over at least one of said first substrate and said second substrate;
   at least one photo-detecting element provided over at least the other of said first substrate and said second substrate;
   a transmission of a signal between said first circuit and said second circuit is performed by converting an optical signal emitted from said light emitting element into an electrical signal at said photo-detecting element, and
   said light emitting element comprises an anode, a cathode and an electroluminescent layer provided between said anode and said cathode.

2. A device according to claim 1, wherein
said anode and said cathode contain a metal, and further reflect the light, and
said optical signal is formed using the light irradiated from an opening formed at either of said anode and said cathode.

3. A device according to claim 1, wherein a resin having a translucency is provided at a gap between said respective plurality of glass substrates.

4. A device according to claim 3, wherein edge portions of at least two of said plurality of glass substrates are not put in line with said other glass substrates, and
only said resin exists between said corresponding light emitting element and said photo-detecting element over said at least two glass substrates.

5. A semiconductor device comprising:
a plurality of glass substrates;
circuits having semiconductor elements provided over said plurality of glass substrates, respectively;
a pixel section having a plurality of pixels provided for at least one of said plurality of glass substrates,
wherein each of said plurality of glass substrates has both or either of a light emitting element and a photo-detecting element, and
a transmission of a signal between said respective circuits and said pixel sections formed in said plurality of glass substrates is performed by converting an optical signal emitted from said light emitting element into an electrical signal at said photo-detecting element.

6. A device according to claim 5, wherein said light emitting element has an anode, a cathode and an electroluminescent layer formed between said anode and said cathode,
said anode and said cathode contain a metal, and further reflect the light, and
said optical signal is formed using the light irradiated from an opening formed at either of said anode and said cathode.

7. A device according to claim 5, wherein a resin having a translucency is provided at a gap between said respective plurality of glass substrates.

8. A device according to claim 7, wherein edge portions of at least two of said plurality of glass substrates are not put in line with said other glass substrates, and
only said resin exists between said corresponding light emitting element and said photo-detecting element over said at least two glass substrates.

9. A semiconductor device comprising:
a plurality of glass substrates;
circuits having semiconductor elements provided over said plurality of glass substrates, respectively,
wherein each of said plurality of glass substrates has both or either of a light emitting element and a photo-detecting element,
a first electrical signal outputted from said circuits is converted into an optical signal by said light emitting element in any one of glass substrates out of said plurality of glass substrates, and
said optical signal is converted into a second electrical signal at said photo-detecting element in one or a plurality of glass substrates except for said one glass substrate out of said plurality of substrates, said second electrical signal is waveform-corrected and inputted into said circuits.

10. A device according to claim 9, wherein said light emitting element has an anode, a cathode and an electroluminescent layer formed between said anode and said cathode,
said anode and said cathode contain a metal, and further reflect the light, and
said optical signal is formed using the light irradiated from an opening formed at either of said anode and said cathode.

11. A device according to claim 9, wherein a resin having a translucency is provided at a gap between said respective plurality of glass substrates.

12. A device according to claim 11, wherein edge portions of at least two of said plurality of glass substrates are not put in line with said other glass substrates, and
only said resin exists between said corresponding light emitting element and said photo-detecting element over said at least two glass substrates.

13. A semiconductor device comprising:
a plurality of glass substrates;
circuits having semiconductor elements provided over said plurality of glass substrates, respectively,
wherein each of said plurality of glass substrates has both or either of a light emitting element and a photo-detecting element,
a pixel section having a plurality of pixels is provided for at least one of said plurality of glass substrates,
a first electrical signal outputted from said circuits is converted into an optical signal by said light emitting element in any one of glass substrates except for glass substrates over which said pixel section is provided out of said plurality of glass substrates, and
said optical signal is converted into a second electrical signal at said photo-detecting element in glass substrates over which said pixel section is provided, and an image is displayed at said pixel section by said second electrical signal.

14. A device according to claim 13, wherein said light emitting element has an anode, a cathode and an electroluminescent layer formed between said anode and said cathode,
said anode and said cathode contain a metal, and further reflect the light, and
said optical signal is formed using the light irradiated from an opening formed at either of said anode and said cathode.

15. A device according to claim 13, wherein a resin having a translucency is provided at a gap between said respective plurality of glass substrates.

16. A device according to claim 15, wherein edge portions of at least two of said plurality of glass substrates are not put in line with said other glass substrates, and
only said resin exists between said corresponding light emitting element and said photo-detecting element over said at least two glass substrates.

17. A semiconductor device comprising:
a plurality of glass substrates;
circuits having semiconductor elements provided over said plurality of glass substrates, respectively;
a pixel section having a plurality of pixels provided in at least one of said plurality of glass substrates; and
a first light emitting element and a TFT provided at each pixel of said plurality of pixels,
wherein each of a plurality of glass substrates has both or either of a second light emitting element and a photo-detecting element, and a transmission of a signal between said respective circuits and said pixel sections provided in said plurality of glass substrates is performed by converting an optical signal emitted from said second light emitting element into an electrical signal at said photo-detecting element.

18. A device according to claim 17, wherein said second light emitting element has an anode, a cathode and an electroluminescent layer provided between said anode and said cathode, said anode and said cathode contain a metal and further reflect the light, and said optical signal is formed using the light irradiated from an opening formed at either of said anode and said cathode.

19. A device according to claim 17, wherein a resin having a translucency is provided at a gap between said respective plurality of glass substrates.

20. A device according to claim 19, wherein edge portions of at least two of said plurality of glass substrates are not put in line with said other glass substrates, and only said resin exists between said corresponding second light emitting element and said photo-detecting element in said at least two glass substrates.

21. A semiconductor device comprising:

a plurality of glass substrates;

circuits having semiconductor elements provided over said plurality of glass substrates, respectively;

a pixel section having a plurality of pixels and provided in at least one of said plurality of glass substrates; and a first light emitting element and a TFT provided at each pixel of said plurality of pixels, wherein each of a plurality of glass substrates has both or either of a second light emitting element and a photo-detecting element, a first electrical signal outputted from said circuits is converted into an optical signal by said light emitting element in any one of glass substrates except for glass substrates in which said pixel section is provided out of said plurality of glass substrates, and said optical signal is converted into a second electrical signal at said photo-detecting element in glass substrates in which said pixel section is provided, and a luminance of said first light emitting element is controlled by said second electrical signal.

22. A device according to claim 21, wherein said second light emitting element has an anode, a cathode and an electroluminescent layer provided between said anode and said cathode, said anode and said cathode contain a metal and further reflect the light, and said optical signal is formed using the light irradiated from an opening formed at either of said anode and said cathode.

23. A device according to claim 21, wherein a resin having a translucency is provided at a gap between said respective plurality of glass substrates.

24. A device according to claim 23, wherein edge portions of at least two of said plurality of glass substrates are not put in line with said other glass substrates, and only said resin exists between said corresponding second light emitting element and said photo-detecting element in said at least two glass substrates.

25. A microprocessor comprising:

a plurality of glass substrates; and

CPU cores and cache memories provided over said plurality of glass substrates, respectively, wherein each of a plurality of glass substrates has both or either of a light emitting element and a photo-detecting element, and a transmission of a signal between said respective CPU cores provided over said plurality of glass substrates is performed by converting an optical signal emitted from said light emitting element into an electrical signal at said photo-detecting element.

26. A microprocessor according to claim 25, wherein said light emitting element has an anode, a cathode and an electroluminescent layer provided between said anode and said cathode, said anode and said cathode contain a metal and further reflect the light, and said optical signal is formed using the light irradiated from an opening formed at either of said anode and said cathode.

27. A microprocessor according to claim 25, wherein a resin having a translucency is provided at a gap between said respective plurality of glass substrates.

28. A microprocessor according to claim 27, wherein edge portions of at least two of said plurality of glass substrates are not put in line with said other glass substrates, and only said resin exists between said corresponding light emitting element and said photo-detecting element in said at least two glass substrates.

29. A microprocessor comprising:

a plurality of glass substrates; and

CPU cores and cache memories provided over said plurality of glass substrates, respectively, wherein each of a plurality of glass substrates has both or either of a light emitting element and a photo-detecting element, and a first electrical signal outputted from said CPU core or said cache memory is converted into an optical signal by said light emitting element in any one of glass substrates out of said plurality of glass substrates, and said optical signal is converted into a second electrical signal at said photo-detecting element in one or a plurality of glass substrates except for said one glass substrate out of said plurality of glass substrates, said second electrical signal is waveform-corrected and inputted into said CPU core or said cache memory.

30. A microprocessor according to claim 29, wherein said light emitting element has an anode, a cathode and an electroluminescent layer provided between said anode and said cathode, said anode and said cathode contain a metal and further reflect the light, and said optical signal is formed using the light irradiated from an opening formed at either of said anode and said cathode.

31. A microprocessor according to claim 29, wherein a resin having a translucency is provided at a gap between said respective plurality of glass substrates.

32. A microprocessor according to claim 31, wherein edge portions of at least two of said plurality of glass substrates are not put in line with said other glass substrates, and only said resin exists between said corresponding light emitting element and said photo-detecting element in said at least two glass substrates.

* * * * *